US010262294B1

(12) United States Patent
Hahn et al.

(10) Patent No.: US 10,262,294 B1
(45) Date of Patent: Apr. 16, 2019

(54) LOCATION ESTIMATION USING ARRAY OF CAPACITIVE SENSORS

(71) Applicant: AMAZON TECHNOLOGIES, INC., Seattle, WA (US)

(72) Inventors: Camerin Cole Hahn, Redmond, WA (US); Qicai Shi, Bellevue, WA (US); Christopher Raymond Grajewski, Seattle, WA (US); Vinod Lakhi Hingorani, Sammamish, WA (US); Nathan Pius O'Neill, Snohomish, WA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 294 days.

(21) Appl. No.: 15/082,468

(22) Filed: Mar. 28, 2016

(51) Int. Cl.
| | |
|---|---|
| *G06Q 10/08* | (2012.01) |
| *G01D 5/26* | (2006.01) |
| *G01D 5/24* | (2006.01) |
| *G01G 19/52* | (2006.01) |

(52) U.S. Cl.
CPC ............. *G06Q 10/087* (2013.01); *G01D 5/24* (2013.01); *G01D 5/26* (2013.01); *G01G 19/52* (2013.01)

(58) Field of Classification Search
None
See application file for complete search history.

(56) References Cited

U.S. PATENT DOCUMENTS

| | | | |
|---|---|---|---|
| 7,225,980 B2 | 6/2007 | Ku et al. | |
| 7,949,568 B2 | 5/2011 | Fano et al. | |
| 8,009,864 B2 | 8/2011 | Linaker et al. | |
| 8,189,855 B2 | 5/2012 | Opalach et al. | |
| 8,630,924 B2 | 1/2014 | Groenevelt et al. | |
| 9,123,018 B2 * | 9/2015 | Gentile | G06Q 10/087 |
| 9,235,928 B2 | 1/2016 | Medioni et al. | |
| 9,727,838 B2 | 8/2017 | Campbell | |
| 9,911,048 B2 | 3/2018 | Jones et al. | |
| 9,984,355 B2 | 5/2018 | Jones et al. | |
| 2006/0071774 A1 | 4/2006 | Brown et al. | |

(Continued)

FOREIGN PATENT DOCUMENTS

CN 103177353 6/2013

OTHER PUBLICATIONS

Metzger, Christian, et al. "Flexible-Foam-Based Capacitive Sensor Arrays for Object Detection at Low Cost." Applied Physics Letters, vol. 92, No. 1, 2008, p. 013506, doi:10.1063/1.2830815.*

(Continued)

*Primary Examiner* — Joseph Schoenholtz
(74) *Attorney, Agent, or Firm* — Lindauer Law, PLLC

(57) ABSTRACT

A user may pick, place, or move an item at an inventory location, such as a shelf. Described are techniques to determine a location of one or more of an object, such as an item or a user, with respect to an array of capacitive sensors. The array may be part of the shelf. As an item is added to, moved or removed from the shelf, when the user's hand is near the shelf, and so forth, capacitance measured by one or more of the sensors in the array may change. Based on these changes, a location relative to the sensor array may be determined. A particular shelf may have different areas, each designated as holding a different type of item. The location information obtained from the capacitive sensors may be used to determine which item on the shelf was interacted with.

20 Claims, 18 Drawing Sheets

(56) References Cited

U.S. PATENT DOCUMENTS

| | | | |
|---|---|---|---|
| 2007/0050271 | A1 | 3/2007 | Ufford et al. |
| 2007/0261894 | A1 | 11/2007 | Harish |
| 2009/0114041 | A1* | 5/2009 | Harish ............... G06Q 10/087 |
| | | | 73/862.626 |
| 2011/0011936 | A1 | 1/2011 | Morandi et al. |
| 2011/0153466 | A1 | 6/2011 | Harish et al. |
| 2012/0284132 | A1 | 11/2012 | Kim et al. |
| 2013/0222135 | A1 | 8/2013 | Stein et al. |
| 2013/0284806 | A1 | 10/2013 | Margalit |
| 2015/0041616 | A1* | 2/2015 | Gentile ............... G06Q 10/087 |
| | | | 248/550 |
| 2015/0086107 | A1 | 3/2015 | Dedeoglu et al. |
| 2016/0026032 | A1* | 1/2016 | Moore ............... G06K 7/10316 |
| | | | 382/103 |
| 2017/0108370 | A1* | 4/2017 | Pyne ..................... G01G 19/42 |
| 2017/0124603 | A1* | 5/2017 | Olson ............... G06Q 30/0277 |

OTHER PUBLICATIONS

C. Metzger, J. Meyer, E. Fleisch, and G. Tröster, Proceedings of the Fifth International Conference on Pervasive Computing, Toronto, 2007.*

Asthana, et al., "An indoor wireless system for personalized shopping assistance", CiteSeerX, In Proceedings of IEEE Workshop on Mobile Computing Systems and Applications, 1994; [retrieved on Jun. 30, 2013]. Retrieved from the Internet: <URL:http://citeseerx.ist.psu.edu/viewdoc/summary?doi=10.1.1.127.3033>.

Kalnikaite, et al., "How to Nudge In Situ: Designing Lambent Devices to Deliver Information Salience in Supermarkets", ACM, In proceeding of: UbiComp 2011: Ubiquitous Computing, 13th International Conference, UbiComp 2011, Beijing, China, Sep. 17-21, 2011. Retrieved from Internet: <URL:http://www.researchgate.net/publication/221568350_How_to_nudge_in_Situ_designing_lambent_devices_to_deliver_salient_information_in_supermarkets.

Pop, Cristian, "Introduction to the BodyCom Technology", AN1391, DS01391A, Microchip Technology, Inc., May 2, 2011.

Wang, David, "Capacitive Sensing: Ins and Outs of Active Shielding", Texas Instruments, Application Report, SNOA926A, Feb. 2015. Retrieved from the Internet <URL: http://www.ti.com/lit/an/snoa926a/snoa926a.pdf>.

Schoenholtz, Joseph, "Non-final Office Action dated Mar. 28, 2018", U.S. Appl. No. 15/082,903, The United States Patent and Trademark Office, filed Mar. 28, 2018.

Smith, Graham P., "Notice of Allowance dated Apr. 30, 2018", U.S. Appl. No. 15/082,711, The United States Patent and Trademark Office, filed Apr. 30, 2018.

Schoenholtz, Joseph, "Notice of Allowance dated Sep. 6, 2018", U.S. Appl. No. 15/082,903, The United States Patent and Trademark Office, filed Sep. 6, 2018.

Smith, Graham P., "Notice of Allowance dated Jan. 12, 2018", U.S. Appl. No. 15/082,711, The United States Patent and Trademark Office, filed Jan. 12, 2018.

* cited by examiner

LOCATION ESTIMATION USING ARRAY OF CAPACITIVE SENSORS

BACKGROUND

Retailers, wholesalers, and other product distributors typically maintain an inventory of various items that may be ordered, purchased, leased, borrowed, rented, viewed, and so forth, by clients or customers. For example, an e-commerce website may maintain inventory in a fulfillment center. When a customer orders an item, the item is picked from inventory, routed to a packing station, packed, and shipped to the customer. Likewise, physical stores maintain inventory in customer accessible areas, such as in a shopping area, and customers can pick items from inventory and take them to a cashier for purchase, rental, and so forth.

Many physical stores also maintain inventory in a storage area, fulfillment center, or other facility that can be used to replenish inventory located in the shopping areas or to satisfy orders for items that are placed through other channels (e.g., e-commerce). Other examples of entities that maintain facilities holding inventory include libraries, museums, rental centers, and so forth. In each instance, for an item to be moved from one location to another, it is picked from its current location and transitioned to a new location. It is often desirable to monitor quantity or movement of inventory within the facility.

BRIEF DESCRIPTION OF FIGURES

The detailed description is set forth with reference to the accompanying figures. In the figures, the left-most digit(s) of a reference number identifies the figure in which the reference number first appears. The use of the same reference numbers in different figures indicates similar or identical items or features. The figures are not necessarily drawn to scale, and in some figures, the proportions or other aspects may be exaggerated to facilitate comprehension of particular aspects.

Figure 1:
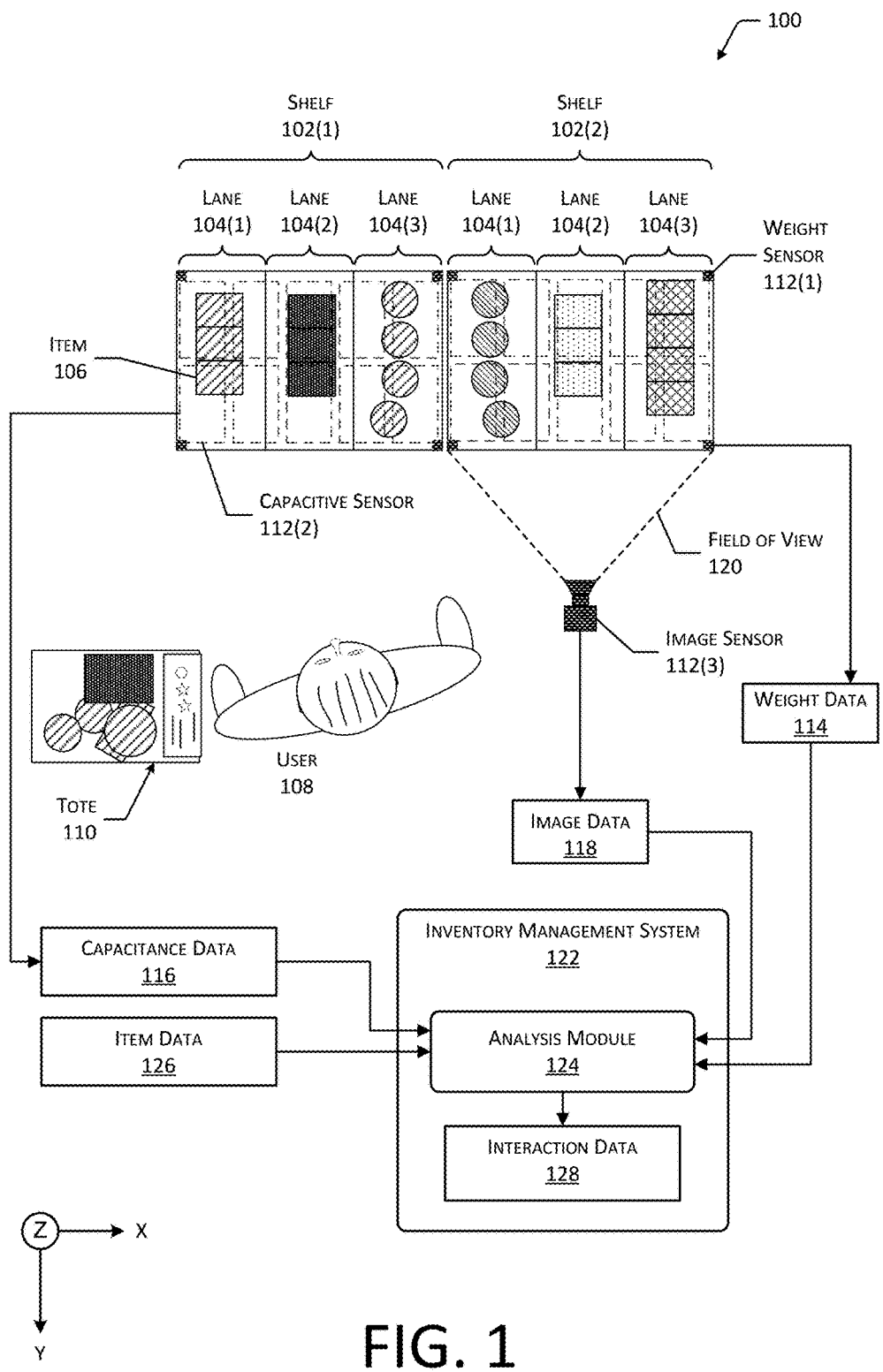
FIG. 1 illustrates a system using sensors such as capacitive sensors and weight sensors to generate interaction data about an inventory location, according to some implementations.

While implementations are described herein by way of example, those skilled in the art will recognize that the implementations are not limited to the examples or figures described. It should be understood that the figures and detailed description thereto are not intended to limit implementations to the particular form disclosed but, on the contrary, the intention is to cover all modifications, equivalents, and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean "including, but not limited to".

DETAILED DESCRIPTION

Described in this disclosure are systems and techniques for generating interaction data at an inventory location, such as in a materials handling facility (facility). The facility may include, or have access to, an inventory management system. The inventory management system may be configured to maintain information about items, users, condition of the facility, and so forth. For example, the inventory management system may maintain data indicative of a number of items at a particular inventory location, what items a particular user is ordered to pick, how many items have been picked or placed at the inventory location, requests for assistance, environmental status of the facility, and so forth.

Operation of the facility may be facilitated by using one or more sensors to acquire information about interactions in the facility. The inventory management system may process the sensor data from the one or more sensors to determine interaction data. The interaction data is indicative of action such as picking or placing an item at a particular inventory location, presence of the user at the inventory location, and so forth. For example, the inventory management system may use the sensor data to generate interaction data that determines a type of item a user picked from a particular inventory location.

An inventory location may include shelves, hangers, and so forth, that hold or otherwise support a type of item. The inventory location may be arranged into sections, such as lanes on a shelf. For example, a shelf may have three lanes, with each lane holding a different type of item. Items may be added to (placed) or removed (picked) from the inventory location, moved from one inventory location to another, and so forth.

The inventory location may include capacitive sensors, weight sensors, image sensors, and so forth. An inventory management system may use the data from these sensors to determine the interaction data. The capacitive sensors may include one or more conductive elements arranged at or proximate to the inventory location. For example, an array of conductive elements may be arranged beneath a protective layer of the shelf. Objects on or above the conductive elements may result in a particular electrical capacitance of the particular conductive element. For example, the presence of an item may result in a first capacitance value while the absence of the item may result in a second capacitance value. Given a previously known arrangement of the conductive elements, an estimated location of an interaction or an object may be determined. The interaction may include an item being picked or placed to the inventory location, the hand of the user, a manipulator of robot, and so forth.

The array of conductive elements may comprise a variety of different arrangements of the conductive elements. In one arrangement, the conductive elements may be approximately rectangular and arranged in one or more rows and columns. A location of an object may be determined using the capacitive values from a plurality of the conductive elements. For example, a minimum mean square error estimation function may use the capacitance values from two or more conductive elements to determine an estimated location of an object relative to those conductive elements. In another arrangement, the conductive elements may be arranged as right triangles, with two triangles arranged such that their respective longest sides are adjacent to one another. A location of an object may be determined with respect to these triangular conductive elements based at least in part on a ratio or difference between the capacitance values obtained by each. For example, the first capacitance value obtained using a first triangular conductive element and a second capacitance value obtained using a second triangular conductive element may be approximately the same when a homogenous object is located proximate to the midpoints of the longest sides of each triangle.

The capacitive sensors may be configured to utilize a far-field capacitance effect. The far-field capacitance effect may be determined by measuring the self-capacitance of the conductive elements, rather than a mutual capacitance. In one implementation, a known charge may be provided to the conductive element, and the resultant voltage may be measured between the conductive element and the ground. A shield comprising an electrical conductor may be arranged along one or more side of the conductive element. For example, the shield may be separated from the conductive element by an electrical insulator. During operation, the shield may be driven to the same, (or a substantially similar) electrical potential as that provided to the conductive element. As a result of this, a voltage difference that is below a threshold voltage is present between the shield and the conductive element. In some implementations, the voltage difference may be zero. The shield in this configuration directs the electric field generally away from the shield. This directionality may be used to prevent erroneous readings for objects on the back side of the conductive element, such as may occur in an unshielded configuration. In some implementations, a ground plane may be arranged behind the shield, opposite the conductive element. The ground plane may comprise an electrically conductive material that is separated from the shield by an electrical insulator. The ground plane may be connected to an earth ground in some implementations.

Proximity of an object to the conductive element or contact by the object to the conductive element affects the charge on the conductive element, producing a change in the resultant voltage that may then be measured and used to determine a capacitance value.

During operation, a switch module may comprise circuitry used to switch or selectively connect a capacitive sensor module to a particular conductive element. Once connected, a charge may be applied to the conductive element. A voltage, capacitance, resistance, or other electrical characteristic may be measured by the capacitive sensor module which may then generate capacitance data.

The switch circuitry may scan across a plurality of conductive elements in a particular sequence. During operation, the switch circuitry may be designed to prevent the operation of two conductive elements that are adjacent to one another to avoid interference. For example, the first conductive element and second conductive element that are side-by-side on a shelf would not be activated simultaneously. The conductive elements for each shelf or group of shelves on a rack may be driven using a particular capacitive sensor module and a corresponding switch module. In a relatively dense environment, such as a warehouse where shelves on adjacent racks may be located side-by-side, operation of one shelf with a corresponding set of capacitive sensor modules and switch modules may result in interference to an adjacent shelf and its corresponding set of capacitive sensor modules and switch modules.

To mitigate or eliminate potential interference between capacitive sensors at adjacent inventory locations, operation of these capacitive sensors may be coordinated to avoid mutual interference by using a seed value. A particular grouping of capacitive sensors having conductive elements under the control of the switch module, such as on a particular shelf or group of shelves, is assigned a particular seed value. This seed value differs from the seed value used by an adjacent grouping of capacitive sensors. The seed value may be used to generate sequence data, which may then be used to control the operation of the capacitive sensors. For example, a first rack of shelves that have a first common capacitive sensor module and first switch module may receive a first seed value that is used to generate first sequence data. Sequence data may comprise a set of data elements, each element indicative of a conductive element. The sequence data may then be used to operate the conductive elements. Continuing the example, a second rack of shelves adjacent to the first rack of shelves has a second common capacitive sensor module and a second switch module that receives a second seed value different from the first seed value. From this second seed value, second sequence data is generated. The first sequence data and the second sequence data differ from one another, resulting in different sequences in which the conductive elements are activated between the adjacent shelves. By using different sequences, mutual interference between capacitive sensors may be reduced or eliminated.

In another implementation, sequence data may be generated by using the seed value that has been received from an external device, such as a server, as an input to a random or pseudorandom function. By coordinating the distribution of seed values such that physically adjacent devices receive different seed values, the resulting sequence data between adjacent capacitive sensors differs and interference is mitigated. In some implementations, the sequence data may include pauses such as a particular time delay value.

Use of the seed value thus prevents adjacent capacitive sensors from entering into a phase lock situation that results in persistent or ongoing interference. While it may still be possible in some implementations for two adjacent capacitive sensors to be activated contemporaneously and produce interference with one another, the frequency and duration of such interference is significantly reduced.

In some implementations, the conductive elements that are part of the capacitive sensor may serve multiple purposes. For example, the switch module may selectively connect a particular conductive element either to the capacitive sensor module or to a radio module. While connected to the capacitive sensor module, the conductive element may be used to determine a capacitance value. While connected to the radio module, the conductive element may be used as an antenna to send or receive radio frequency signals. In one implementation, a change in the capacitance data that exceeds a threshold value may result in the switch module connecting the conductive element to the radio module. The radio module may then send a signal, such as an interrogation signal or a radio frequency identification (RFID) tag, using the conductive element as an antenna. After a radio frequency response has been received, or predetermined amount of time elapses, the switch module may disconnect the conductive element from the radio module and reconnect conductive element to the capacitive sensor module. As described above, in some implementations, sequence data may be used to control the order in which conductive elements are operated for generation of capacitance data.

The radio module may use an antenna matching network module to connect to a dedicated antenna or to the conductive element acting as an antenna. The antenna matching network module may also be known as an antenna tuner, transmatch, antenna tuning unit, antenna coupler, and so forth. The antenna matching network module may include one or more electronic components such as inductors, capacitors, resistors, transformers, and so forth, that may be configured to provide a particular impedance match between the radio module and the antenna. Data indicative of a particular matching network configuration may be used to configure the antenna matching network module to provide a particular impedance match. For example, the matching network configuration may specify a particular configuration or connection between inductors and capacitors of particular values to provide circuitry that will transform one impedance to another impedance.

The impedance of an antenna and associated feedline may vary based on a variety of factors, including frequency of operation, proximity of other objects, and so forth. For example, an object that is close to an antenna may change the impedance of that antenna. By utilizing the antenna matching network module to perform impedance matching between the radio module and the antenna, power transfer between the two may be improved. Also, in some situations, an impedance mismatch that is greater than the threshold value may result in power from the transmitter of the radio module being reflected back to the final amplifier of the radio module. Such reflected power may, in some situations, result in damage to the transmitter of the radio module.

The capacitance data obtained from a capacitive sensor may be used as input for the antenna matching network module to determine a particular matching network configuration. For example, the capacitance data may be used to determine that no object is near the antenna. Based on this information, a first matching network configuration may be used. Subsequently, an object such as a user, item, and so forth, is moved and placed near the antenna. The presence of this object may change the impedance of the antenna. The capacitance data is used to determine that the object is near the antenna, and subsequently, a second matching network configuration is then used. As a result, a better impedance match between the radio module and the antenna may be obtained that improves overall performance, prevents damage to the radio module, and so forth. The antenna connected to the antenna matching network module may be one or more of the conductive element or a dedicated antenna.

An event detection module may be used to generate event data associated with a particular inventory location. Event data may comprise information that is indicative of a change associated with an inventory location. For example, the event data may indicate that one or more types of sensor data have exceeded particular thresholds or met other conditions.

The event data may be used to trigger or initiate other actions. For example, event data may indicate occurrence of a change in capacitance values that exceeds a threshold value. Responsive to this event data, processing of weight data obtained from weight sensors at a time corresponding to the event data may take place. Weight data alone is subject to noise, such as vibration or other movements in the environment. By using the event data, such as obtained from a capacitive sensor, a particular portion or set of weight data may be considered, mitigating the effects of noise. The capacitive sensor and resulting capacitance data is relatively immune to the sources of noise that affect the weight sensor, such as vibration. The event data may be used to determine the weight data used to generate interaction data. For example, based on a change in weight from before and after the time of the event data, a quantity of a type of item added to or removed from the inventory location may be determined.

A variety of other techniques are also described to generate the interaction data. For example, an estimated location of an interaction with respect to the inventory location may be determined using one or more of the capacitance data, the weight data, image data, or other sensor data. A particular type of item may be associated with the estimated location. For example, capacitance data may indicate a change in capacitance at a first lane on the shelf, weight data may indicate a change in weight that corresponds to the first lane, image data may be processed to determine movement within the first lane, and so forth. Continuing the example, based at least in part on this sensor data, interaction data may be generated that indicates a particular quantity of a particular type of item was picked or placed from the lane.

By using the techniques described herein, operation of the facility may be improved. Details about interactions between users and items in the facility may be quickly and accurately determined. For example, as items are picked, placed, and so forth, information such as inventory levels based on changes in the count of items at the inventory locations may be readily and more accurately determined.

As a result, the inventory management system may be able to quickly track what item a user has interacted with, maintain up-to-date inventory information, and so forth.

Illustrative System

FIG. 1 illustrates a system 100 using a variety of sensors to generate interaction data about an inventory location, according to some implementations. A shelf 102 may include one or more lanes 104. The lanes 104 are an area upon the shelf 102 that is associated with a particular type of item 106. For example, the shelf 102 depicted here has three lanes 104(1), 104(2), and 104(3). First lane 104(1) may be associated with storing some quantity of first item 106(1) such as cat food, while second lane 104(2) may be associated with storing some quantity of second item 106(2) such as dog food, and third lane 104(3) may be associated with storing some quantity of third item 106(3) such as fish food. Shelves 102 may be adjacent to one another. As depicted here, the first shelf 102(1) is adjacent to the second shelf 102(2).

A user 108 may interact with the shelf 102 or the lanes 104 at the shelf 102. For example, the user 108 may remove first item 106(1) from the first lane 104(1) and place the first item 106(1) into a tote 110. The tote 110 may be associated with the user 108 or that user's 108 user account. The user 108 may pick items 106 from the shelf 102 and place them in the tote 110, or may place items 106 from the tote 110 to the shelf 102.

Each shelf 102 may include or be associated with one or more sensors 112. The sensors 112 may be positioned to gather information about the shelf 102 or other type of inventory location. Circuitry associated with the one or more weight sensors 112(1) generates weight data 114. For example, a weight sensor 112(1) may be arranged proximate to each of the four corners of a rectangular shelf 102. Output from each weight sensor 112(1) may be used to produce the weight data 114 that includes weight values for each of the corners at particular times.

The shelf 102 may include or be proximate to one or more capacitive sensors 112(2). For example, the conductive elements of the capacitive sensor 112(2) may be located on, in, or below a surface of the shelf 102 upon which items 106 may rest. Various structures and arrangements of the conductive elements are described in more detail with regard to FIGS. 2, 3, and elsewhere within the application.

The capacitive sensor 112(2) includes capacitive sensing circuitry that generates capacitance data 116. The capacitive sensing circuitry may use various techniques to determine capacitance. For example, the capacitive sensing circuitry may include a source that provides a predetermined voltage, a timer, and circuitry to measure voltage of the conductive element relative to the ground. By determining an amount of time that it takes to charge the conductive element to a particular voltage, the capacitance may be calculated. The capacitive sensing circuitry may use one or more of analog or digital circuits to determine capacitance. During operation the capacitive sensor 112(2) that has a conductive element beneath a first lane 104(1) may produce capacitance data 116 indicating capacitance values at particular times.

One or more image sensors 112(3) may be used to acquire image data 118 at or near the shelf 102 or other inventory location. The image data 118 may comprise one or more still images, video, or combination thereof. The image sensor 112(3) may have a field of view (FOV) 120 that includes at least a portion of the shelf 102 or other type of inventory location. For example, a camera may be mounted within the shelf 102 to acquire image data 118 of one or more lanes 104.

In some implementations, each lane 104 or group of lanes 104 may have one or more respective sensors 112. For example, each lane 104 may have or be associated with one or more of a weight sensor 112(1), capacitive sensor 112(2), image sensor 112(3), and so forth. Each lane 104 may have one or more of each type of sensor 112 as well.

An inventory management system 122 may access the sensor data generated by the sensors 112. The inventory management system 122 may be configured, as described below, to perform various functions such tracking changes to a quantity on hand of the items 106 at the shelf 102.

The inventory management system 122 may include or have access to an analysis module 124. The analysis module 124 may access information including, but not limited to, item data 126, sensor data, or other information.

The item data 126 provides information about a particular type of item 106, including characteristics of that type of item 106 such as physical dimensions, where that type of item 106 is located in the facility, characteristics about how the item 106 appears, capacitance values associated with the type of item 106, and so forth. For example, the item data 126 may indicate that the type of item 106 is "Bob's Low Fat Baked Beans, 10 oz can" with a stock keeping unit (SKU) number of "24076513. The item data 126 may indicate the types and quantities of items 106 that are expected to be stored at that particular inventory location such as in a particular lane 104 on a shelf 102, width and depth of that type of item 106, weight of the item 106 individually or in aggregate, sample images of the type of item 106, and so forth.

The item data 126 may include an item identifier. The item identifier may be used to distinguish one type of item 106 from another. For example, the item identifier may include SKU string, Universal Product Code (UPC) number, radio frequency identification (RFID) tag data, and so forth. The items 106 that are of the same type may be referred to by the same item identifier. For example, cans of beef flavor Brand X dog food may be represented by the item identifier value of "9811901181". In other implementations, non-fungible items 106 may each be provided with a unique item identifier, allowing each to be distinguished from one another.

The item data 126 may include one or more geometry data, item weight data, sample image data, sample capacitance data, or other data. The geometry data may include information indicative of size and shape of the item 106 in one, two, or three dimensions. For example, the geometry data may include the overall shape of an item 106, such as a cuboid, sphere, cylinder, and so forth. The geometry data may also include information such as length, width, depth, and so forth, of the item 106. Dimensional information in the geometry data may be measured in pixels, centimeters, inches, arbitrary units, and so forth. The geometry data may be for a single item 106, or a package, kit, or other grouping considered to be a single item 106.

The item weight data comprises information indicative of a weight of a single item 106, or a package, kit, or other grouping considered to be a single item 106. The item data 126 may include other data. For example, the other data may comprise weight distribution of the item 106, point cloud data for the item 106, and so forth.

The sample capacitance data may comprise data indicative of a previously measured or calculated change in capacitance of a representative capacitive sensor 112(2) based on the presence or absence of a sample of the type of item 106. For example, during processing or intake of the item 106 at the facility, a sample of the type of item 106 may be placed on a capacitive sensor 112(2) to generate the sample capacitance data.

The sample image data may comprise one or more images of one or more of that type of item 106. For example, sample image data may be obtained during processing or intake of the item 106 to be used by the facility.

The item data 126 may include one or more inventory location identifiers (IDs). The inventory location ID is indicative of a particular area or volume of an inventory location such as a shelf 102 that is designated for stowage of the type of item 106. For example, a single shelf 102 may have several lanes 104, each with a different inventory location ID. Each of the different inventory location IDs may be associated with a lane 104 having a particular area on the shelf 102 designated for storage of a particular type of item 106. A single type of item 106 may be associated with a particular inventory location ID, a plurality of inventory location IDs may be associated with the single type of item 106, more than one type of item 106 may be associated with the particular inventory location ID, and so forth.

The item data 126 may also include quantity data. The quantity data may comprise a count or value indicative of a number of items 106. The count may be a measured or an estimated value. The quantity data may be associated with a particular inventory location ID, for an entire facility, and so forth. For example, the same type of item 106 may be stored at different shelves 104 within the facility. The quantity data may indicate the quantity on hand for each of the different inventory locations.

The analysis module 124 may utilize the weight data 114, the capacitance data 116, the image data 118, the item data 126, and other information to generate interaction data 128. The interaction data 128 is indicative of an action such as picking or placing an item 106 for a particular inventory location, presence of the user 108 at the inventory location, and so forth. Operation of the analysis module is described in more detail below with regard to FIG. 6 and elsewhere.

Figure 2:
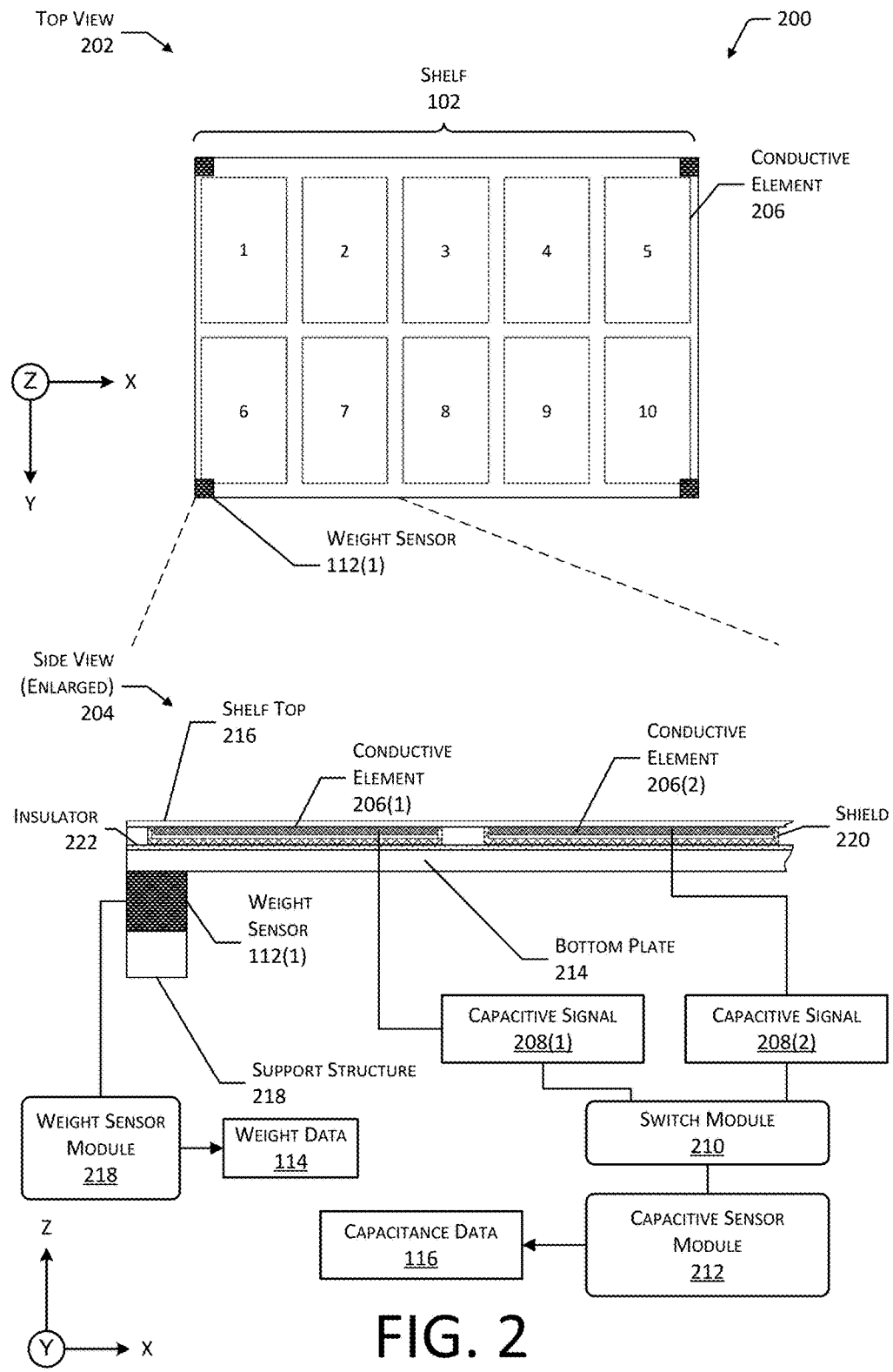
FIG. 2 illustrates the arrangement of conductive elements used for capacitive sensing and weight sensors at an inventory location, according to some implementations.

FIG. 2 illustrates at 200 the arrangement of conductive elements used as part of a capacitive sensor 112(2) and weight sensors 112(1) at an inventory location, according to some implementations. A top view 202 of a shelf 102 and side view 204 of an enlarged portion of the shelf 102 are depicted.

As shown in the top view 202, a plurality of conductive elements 206 are distributed in rows and columns across the shelf 102 to form an array. Arranged proximate to each of the four corners of the shelf 102 are weight sensors 112(1).

As shown in the side view 204, the conductive elements 206 may be connected by wire or other electrical conductor. The wire transfers a capacitive signal 208 between the conductive element 206 and other circuitry, such as a switch module 210. The switch module 210 may in turn connect to a capacitive sensor module 212. For example, the capacitive signal 208 may be used to supply a charge to the conductive element 206. The switch module 210 may comprise switching circuitry that allows for the capacitive sensor module 212 to be selectively connected to a particular conductive element 206. In some implementations, a plurality of switch modules 210 may be used to allow for different switching configurations. For example, a first switch module 210(1) may have 4 outputs, each connecting to additional switch modules 210(2), 210(3), 210(4), 210(5). Each of those switch modules 210(2)-(5) may have 4 outputs in which each output is connected to additional switch modules 210, and so forth. The switching circuitry may comprise microelectromechanical switches, relays, transistors, diodes, and so forth. Other configurations or networks of switch modules 210 may be implemented as well.

The capacitive sensor module 212 may be used to generate the capacitance data 116. The capacitance data 116 may include information such as a capacitance value, information indicative of a particular conductive element 206, timestamp, and so forth. In some implementations, circuitry or functionality of the switch module 210 and the capacitive sensor module 212 may be combined.

A bottom plate 214 may provide mechanical support for one or more of the conductive elements 206. In some implementations, the bottom plate 214 may comprise an electrical conductor that acts as a shield for an electric field present at the conductive element 206.

A shelf top 216 may be arranged atop one or more of the conductive elements 206 and the bottom plate 214. One or more items 106 may rest on or above the shelf top 216. For example, the shelf top 216 may comprise a nonconductive material such as a plastic or ceramic.

The conductive element 206 may comprise one or more electrically conductive materials. The electrically conductive elements 206 may be formed as one or more of a coating, thin-film, paint, deposited material, foil, mesh, and so forth. For example, the conductive element 206 may comprise an electrically conductive paint, silver paste, aluminum film, a copper sheet, and so forth. The conductive element 206 may be deposited upon, embedded within, laminated to, or otherwise supported by the bottom plate 214, the shelf top 216, and so forth. These conductive elements 206 may then be connected to the capacitive sensing circuitry in the capacitive sensor module 212.

One or more shields 220 may be provided. A shield 220 may be adjacent to one or more of the conductive elements 206. The shield 220 comprises an electrically conductive material and is separated by an electrical insulator, such as air, plastic, ceramic, and so forth, from the conductive element 206. A single shield 220 may be used to provide shielding for one or more conductive elements 206. During operation, the shield 220 may be driven at the same voltage potential of the input of the capacitive signal 208. In this configuration, there is no difference in electrical potential between the shield 220 and the conductive element 206. External interference may then couple to the shield 220 producing little interaction with the conductive element 206. The shield 220 may also be used to direct the electric field produced by the conductive element 206 during operation. For example, the electric field is directed generally away from the shield 220. Using this technique, the capacitive sensor 112(2) may detect objects on the side opposite that of the shield 220, with the shield 220 preventing the sensor from "seeing" or being affected by an object behind the shield 220.

Additional layers, omitted for clarity, may be present. For example, an electrical insulator 222 such as polyethylene terephthalate may be arranged between the bottom plate 214 and the shield 220 (if present) or the conductive element 206. Wires, circuit traces, or other electrically conductive pathways may conduct the capacitive signal 208 between the capacitive sensor module 212 and the conductive element 206.

The bottom plate 214 may be supported by one or more of the weight sensors 112(1). In some implementations, the bottom plate 214 may comprise an electrically conductive material and act as a ground plane, such as if connected to an earth ground. The one or more of the weight sensors 112(1) may be connected to the weight sensor module 218. The weight sensor module 218 may comprise circuitry that is used to generate the weight data 114. The weight data 114 may include information such as a weight value, information indicative of a particular weight sensor 112(1), timestamp, and so forth. In some implementations, circuitry or functionality of the weight sensor module 218 and the weight sensor 112(1) may be combined.

Figure 3:
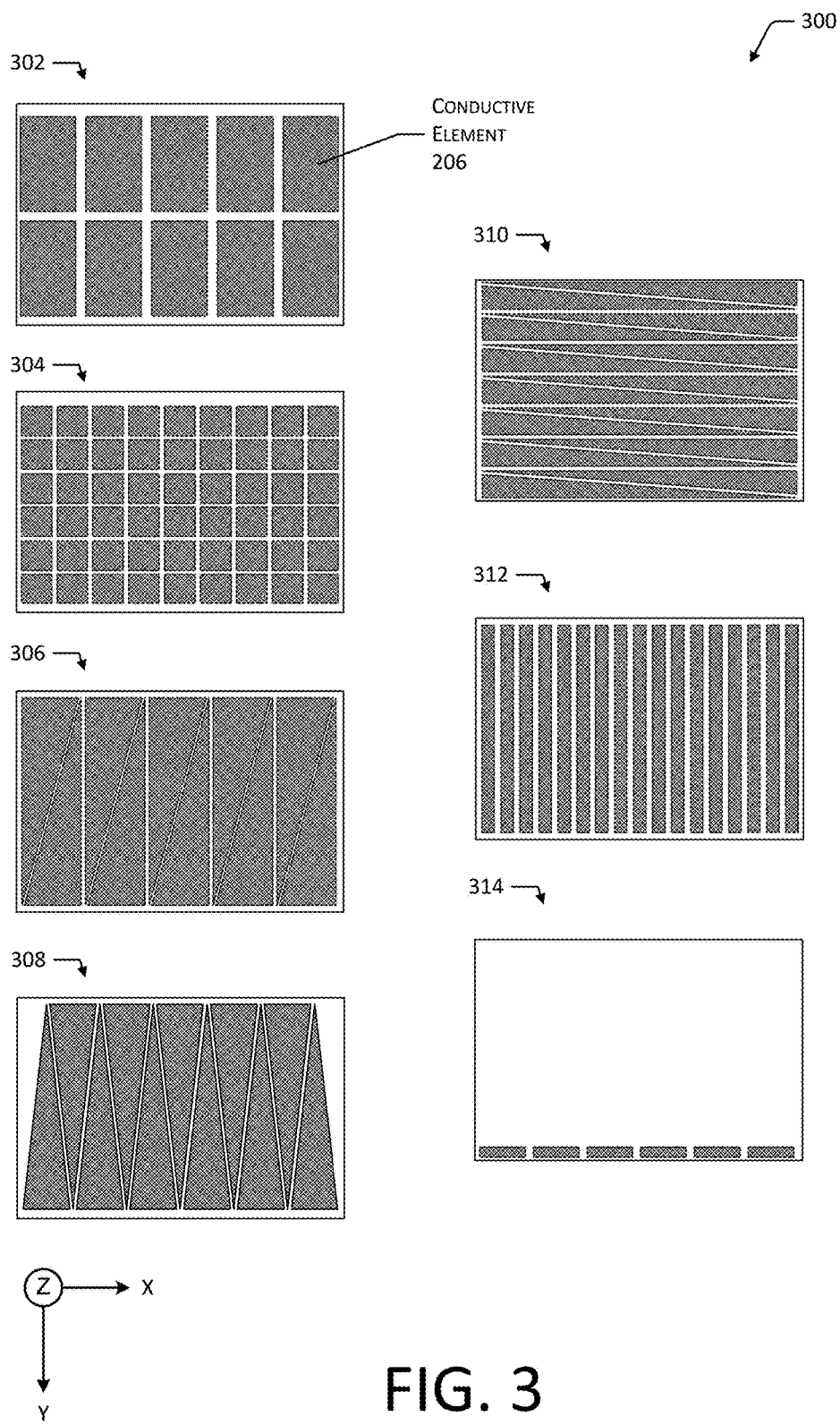
FIG. 3 illustrates several layouts of arrays of conductive elements used for capacitive sensing, according to some implementations.

FIG. 3 illustrates several layouts 300 of arrays of conductive elements 206 used for capacitive sensing, according to some implementations.

A first layout 302 illustrates the conductive elements 206 arranged in rows and columns, with each of the conductive elements 206 having a generally rectangular shape. In other implementations, each of the conductive elements 206 may have different shapes, such as circles, regular polygons, irregular polygons, and so forth.

A second layout 304 illustrates the conductive elements 206 arranged in rows and columns, with each of the conductive elements 206 being generally square in shape.

A third layout 306 depicts the conductive elements 206 arranged in pairs, with each pair comprising a first triangular conductive element 206 and a second triangular conductive element 206. Each of the triangular conductive elements 206 has three sides forming the triangular shape, as well as a top and a bottom. Each of the triangular conductive elements 206 may be a right triangle. The longest side of each triangle, or hypotenuse, may be arranged to be adjacent to the longest side of the other triangle in the pair. When arranged in this manner, an overall shape of the pair of triangular conductive elements 206 is generally square or rectangular. With regard to the third layout 306, a long axis through the pair of triangular conductive elements 206 extends from a front to a back of the shelf 102 or other inventory location.

A fourth layout 308 depicts an arrangement in which the conductive elements 206 are triangular conductive elements 206 arranged adjacent to one another. In the arrangement depicted, the triangles are isosceles triangles. In other implementations, other types of triangles or other geometric shapes may be used.

A fifth layout 310 depicts another arrangement in which the conductive elements 206 are arranged in pairs, with each pair comprising a first triangular conductive element 206 and a second triangular conductive element 206. With regard to the fifth layout 310, a long axis through the pair of triangular conductive elements 206 extends from a left to a right of the shelf 102 or other inventory location.

A sixth layout 312 depicts an arrangement in which the conductive elements 206 comprise strips or rectangles having a long axis that extends from the front to the back of the shelf 102 or other inventory location. In some implementations, the width of the strips may be configured to be less than or equal to the width of a lane 104.

A seventh layout 314 depicts an arrangement in which the conductive elements 206 are arranged along a front edge of the shelf 102 or other inventory location. The front edge is that portion of the shelf 102 or inventory location that is closest to the user 108 during use. With this layout, the capacitive sensors 112(2) with their conductive elements 206 arranged along the front edge may be used to detect a presence of an object such as an item 106 or a portion of the user 108 such as their hand at the shelf 102. Data indicative of the proximity of an object, such as event data, may be used to trigger other actions such as designating particular weight data 114 corresponding to a particular time for further analysis.

Figure 4:
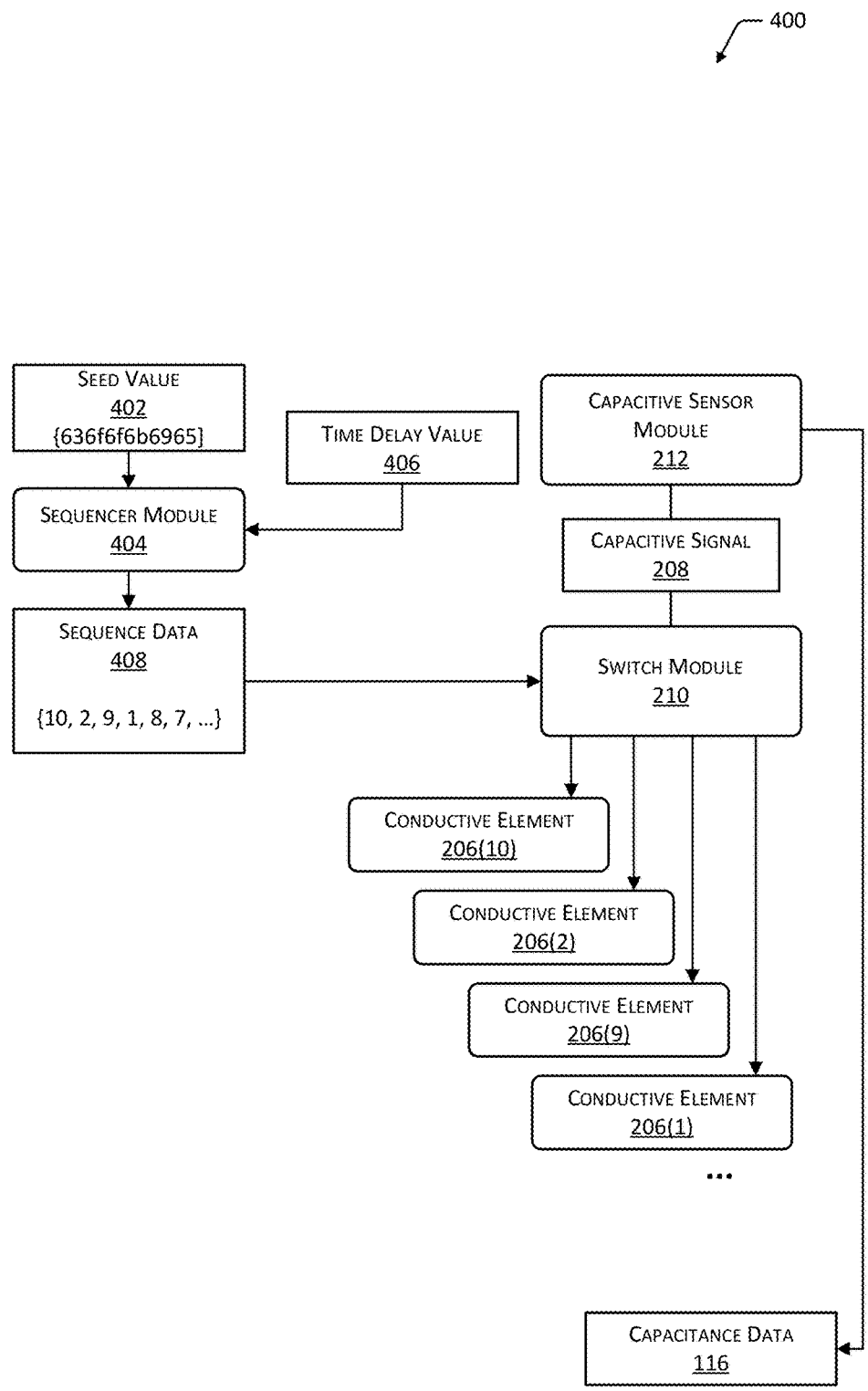
FIG. 4 illustrates a block diagram of using a seed value to generate a sequence of operation of conductive elements in capacitive sensors to minimize interference with other capacitive sensors, according to some implementations.

In other implementations, other layouts may be used. Similarly, other geometric shapes may be used to form the conductive elements 206. For example, the conductive elements 206 depicted in the second layout 304 may be implemented as circles. FIG. 4 illustrates a block diagram 400 of using a seed value 402 to generate a sequence of operation of conductive elements 206 in capacitive sensor modules 212. In some situations, operation of adjacent capacitive sensor modules 212 may result in interference. For example, when a first capacitive sensor module 212(1) on a first shelf 102(1) activates a first conductive element 206(1), a second conductive element 206(2) located on adjacent second shelf 102(2) may pick up interference that is detected by a second capacitive sensor module 212(2) on the second shelf 102(2), or vice versa.

It is advantageous to avoid contemporaneous operation of adjacent conductive elements 206 to mitigate this interference. In some situations, the capacitive sensor module 212 and associated circuitry such as a switch module 210 may be synchronized to operate in conjunction with adjacent units. However, such synchronization may require specialized timing circuitry or other configuration that may be expensive or difficult to implement.

To minimize the likelihood of operation by adjacent conductive elements 206, a seed value 402 may be used. The seed value 402 may comprise an initial value or other information. For example, the seed value 402 may comprise a random number, media access control (MAC) address value of a communication interface associated with the capacitive sensor module 212, and so forth.

The seed value 402 may be provided by a dedicated server, controller, or other external device. For example, a server may send the seed value 402 using a network. Issuance of the seed value 402 to a particular device at a particular inventory location may be made by taking into consideration the physical layout of the facility. For example, a set of predefined seed values 402 may be reused within the same facility so long as the same seed value 402 is not issued to two devices that have conductive elements 206 within a threshold distance of one another.

A sequencer module 404 may accept as input the seed value 402. In some implementations, the sequencer module 404 may also accept as input a time delay value 406. The time delay value 406 may specify one or more of a duration of time, value indicative of a probability, value indicative of weighting, and so forth. For example, the time delay value 406 may specify a duration of 5 milliseconds (ms) and weighting value of "0.001". The weighting value may be used to indicate how often the time delay value 406 is inserted into the sequence.

The sequencer module 404 is configured to generate sequence data 408. The sequence data 408 may comprise data elements, each data element being representative of a capacitive sensor 112(2). The sequence data 408 indicates a particular order in which the capacitive sensors 112(2) or the conductive elements 206 thereof are to be operated. For example, as depicted in FIG. 2, each shelf 102 may include a single capacitive sensor module 212 that may be selectively connected to the 10 conductive elements 206 on that shelf 102 using the switch module 210. The sequencer module 404 may utilize a predefined hash function, random number generator, pseudorandom number generator, or other function that when provided with a seed value 402 generates a particular set of sequence data 408. In some implementations, the function used by the sequencer module 404 may be deterministic, such as a hash that always produces the same sequence data 408 given a particular seed value 402. In other implementations, the function used by the sequencer module 404 may be nondeterministic or pseudo-nondeterministic, such as a pseudorandom number generator that produces an output value that is used in conjunction with the seed value 402 to generate the sequence data 408.

The time delay value 406 may be used as an input to the sequencer module 404. By implementing the use of the time delay value 406, an intentional jitter may be introduced in the timing of the sequence data 408, changing when the particular conductive elements 206 are operated. For example, the time delay value 406 as described above may indicate a 5 ms delay. An instruction or control character indicative of this 5 ms delay may be randomly or pseudo-randomly injected into the sequence data 408. During operation, the switch module 210 may utilize the sequence data 408 to determine a sequence of operation, such as the order in which particular conductive elements 206 are to be energized and have their associated capacitance values determined. The switch module 210 may process the instruction or control character indicative of the delay by pausing or temporarily extending or shortening the interval of operation of a particular conductive element 206, for all conductive elements 206, and so forth. In one example, the traversal of the sequence specified by the sequence data 408 may be suspended for duration of the time specified by the time delay value 406. In another example, a dwell time or time spent sampling using a particular conductive element 206 may be increased. In another example, a dwell time or sample time for one or more of the first plurality of capacitive sensors 112(2) may be increased by a duration of time specified by the time delay value 406. For example, during typical operation the capacitive sensor module 212 may obtain samples at a rate of 100 samples per second. In this example, each conductive element 206 is being used by the capacitive sensor module 212 for 10 ms. When the time delay value 406 is applied, the time spent using one or more of the conductive elements 206 may be extended to 15 ms.

As a result, the overall timing as to when a particular conductive element 206 that appears later with the sequence data 408 will be activated is changed. For example, one conductive element 206 may be scanned for an allocated amount of time plus that specified by the time delay value 406. Use of the time delay value 406 may mitigate or eliminate situations in which two adjacent devices are activated contemporaneously with one another.

The sequence data 408 may describe a sequence of operation of triangular conductive elements 206 that does not correspond with the physical arrangement of those conductive elements 206. For example, referring to the arrangement of conductive elements 206 described in FIG. 2, the sequence data 408 may be configured to avoid sequential operation of conductive elements 206 that may be adjacent to another device. Continuing the example, the sequence data 408 may be configured to avoid operation of conductive element 206(1) followed by conductive element 206(6) and operation of conductive element 206(5) followed by conductive element 206(10) to minimize the duration of interference with adjacent devices.

As the switch module 210 cycles through the conductive elements 206 in the order specified by the sequence data 408, the capacitive sensor module 212 generates capacitance data 116 as described above.

Figure 5:
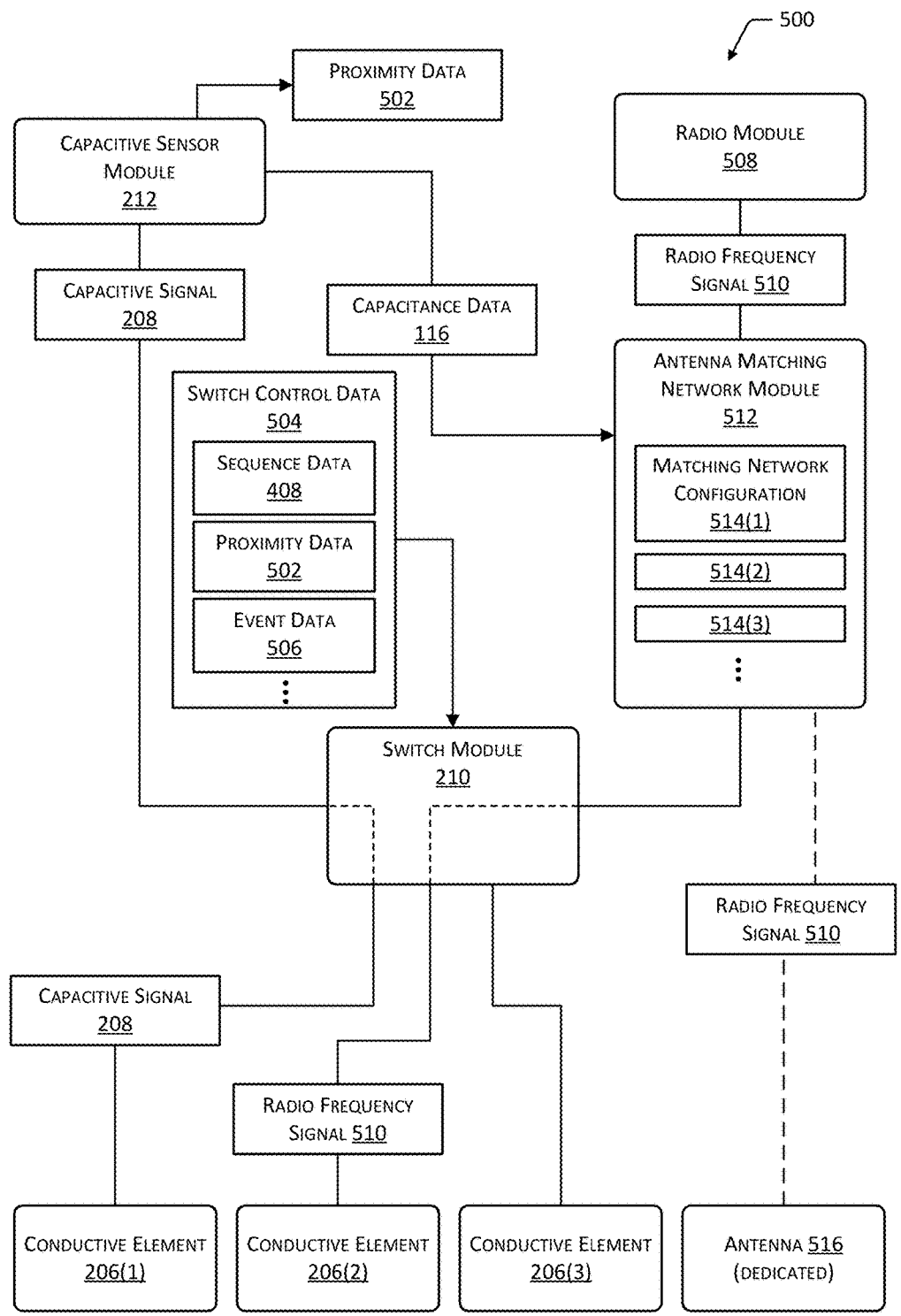
FIG. 5 illustrates a block diagram of conductive elements connected via a switch module to a capacitive sensor module or antenna matching network, according to some implementations.

FIG. 5 illustrates a block diagram 500 of conductive elements 206 connected via a switch module 210 to a capacitive sensor module 212 or antenna matching network, according to some implementations. In other implementations, the various modules described herein may be connected in different ways.

As described above, the capacitive sensor module 212 generates capacitance data 116. The capacitive sensor module 212 may be configured in some implementations to generate proximity data 502. As an object approaches the capacitive sensor 112(2), the capacitance that it measures may change, providing an indication of the presence of the object. For example, a capacitance change value may be determined by calculating a difference between a first capacitance value obtained at a first time and a second capacitance value obtained at a second time. Language indicative of a particular time may indicate a particular instant in time or a particular interval of time that begins or ends at the designated particular time.

If the capacitance change value exceeds a threshold value, proximity data 502 may be generated. In some implementations, the analysis module 124 may generate the proximity data 502, or may generate event data that is indicative of proximity of an object. The object may comprise a user 108, or portion thereof such as a hand, an item 106, a robot, and so forth.

As described above, the capacitive sensor module 212 may send or receive a capacitive signal 208 to a particular conductive element 206. The capacitive signal 208 may comprise either a direct current transfer charge, or an alternating current transfer charge. In some implementations, the switch module 210 may be used to provide an electrical pathway between the capacitive sensor module 212 and one or more of the conductive elements 206. For example, the switch module 210 may comprise an array of field effect transistors (FETs) that may be configured to provide an electrical pathway between particular inputs and particular outputs of the switch module 210.

During operation, the switch module 210 may use switch control data 504 to determine which of the inputs to the switch module 210 are connected to particular ones of the outputs on the switch module 210. The switch control data 504 may include one or more of the sequence data 408, event data 506, the proximity data 502, or other information. For example, switch module 210 may use the sequence data 408 to operate individual ones of the conductive elements 206 and the order specified by the sequence data 408. This process of scanning through the conductive elements 206 in the order specified by the sequence data 408 and generating the corresponding capacitance data 116 may occur until information such as proximity data 502 or event data 506 is received. For example, receipt of the proximity data 502 or event data 506 indicating a change at the shelf 102 may result in the switch module 210 suspending the use of the specified sequence data 408 to provide for different interconnection, such as described below with regard to the radio module 508.

In some implementations, the device at the inventory location may include a radio module 508. The radio module 508 may comprise one or more of a transmitter or a receiver that operates to generate or detect radio frequency signals 510. For example, the radio module 508 may comprise an RFID compatible system that is able to generate an RFID interrogation signal and receive a response from an RFID tag. The radio frequency signals 510 may include those signals having a frequency of at least 50 kHz.

The radio module 508 may be connected to or may otherwise incorporate an antenna matching network module 512. The antenna matching network module 512 may also be known as an antenna tuner, transmatch, antenna tuning unit, antenna coupler, and so forth. The antenna matching network module 512 may include one or more electronic components such as inductors, capacitors, resistors, transformers, and so forth, that may be configured to provide a particular impedance match between the radio module 508 and an antenna. Data indicative of a particular matching network configuration 514 may be used to configure the antenna matching network module 512 to provide a particular impedance match. For example, the matching network configuration 514 may specify a particular configuration or connection between inductors and capacitors of particular values to provide circuitry that will transform one impedance to another.

The impedance of an antenna and associated feedline may vary based on a variety of factors, including frequency of operation, proximity of other objects, and so forth. For example, an object that is close to an antenna may change the impedance of that antenna. By utilizing the antenna matching network module 512 to perform impedance matching between the radio module 508 and the antenna, power transfer between the two may be improved. Also, in some situations, an impedance mismatch that is greater than the threshold value may result in power from the transmitter of the radio module 508 being reflected back to the final amplifier of the radio. Such reflected power may in some situations result in damage to the transmitter.

The capacitance data 116 obtained from a capacitive sensor 112(2) may be used as input for the antenna matching network module 512 to determine a particular matching network configuration. For example, the capacitance data 116 may be used to determine that no object is near the antenna. Based on this information, a first matching network configuration 514(1) may be used. Subsequently, an object such as a user, item, and so forth, is moved and placed near the antenna. The presence of this object may change the impedance of the antenna. The capacitance data 116 is used to determine that the object is near the antenna, and subsequently a second matching network configuration 514(2) is then used. As a result, a better impedance match between the radio module 508 and the antenna may be obtained that improves overall performance, prevents damage to the radio, and so forth. The antenna connected to the antenna matching network module 512 may be one or more of the conductive element 206 or a dedicated antenna 516.

In situations where the dedicated antenna 516 is used, the antenna matching network module 512 may transfer the radio frequency signal 510 to the antenna 516. For example, a feedline or waveguide may be used to transfer the radio frequency signal 510 from the radio module 508 to the antenna 516.

In some implementations, one or more the conductive elements 206 may be used not only as parts of a capacitor to generate capacitance data 116, but they may also be used as an antenna. For example, as depicted in this figure, output from the antenna matching network module 512 may connect to an input of the switch module 210. The switch module 210 may be able to selectively connect a particular conductive element 206 to the antenna matching network module 512. In implementations where no antenna matching network module 512 is used, output from the radio module 508 may be connected to the input of the switch module 210.

In the implementation described above, the switch module 210 may connect the capacitive sensor module 212 at a first time to the conductive element 206. The capacitive signal 208 may be used to generate capacitance data 116. At a second time, the switch module 210 may disconnect the conductive element 206 from the capacitive sensor module 212 and instead may connect the output of the antenna matching network module 512 to the conductive element 206. In this configuration, the conductive element 206 may then act as an antenna.

Returning to the switch control module 210, as described above, the switch control data 504 may be used to determine which of the particular inputs of the switch module 210 are connected to which of the particular outputs of the switch module 210. For example, responsive to the receipt the proximity data 502, the switch module 210 may connect the antenna matching network module 512 to the particular conductive element 206 associated with the proximity data 502 for use as an antenna. In another example, responsive to receipt of event data 506 indicating a weight change on the shelf 102, the switch module 210 may connect the antenna matching network module 512 to the particular conductive element 206 associated with the weight change for use as an antenna.

In some implementations, the switch module 210 may allow for the simultaneous connection of both the capacitive sensor module 212 and the radio module 508 or the antenna matching network module 512 to a particular conductive element 206. For example, the switch module 210, or other modules, may incorporate filtering or isolation circuitry to prevent the capacitive signal 208 from interfering with the radio frequency signal 510, and vice versa.

Figure 6:
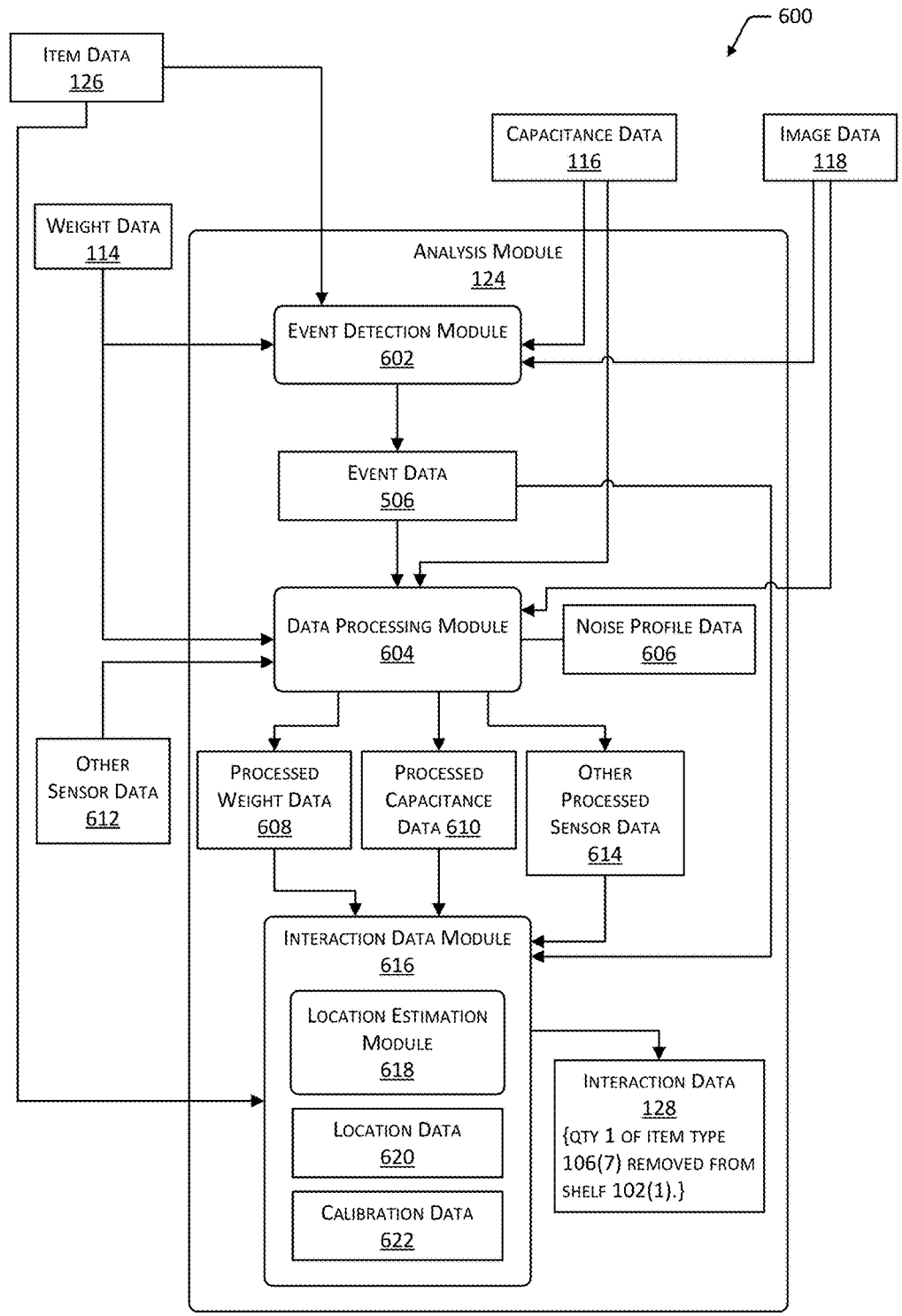
FIG. 6 illustrates a block diagram of an analysis module generating interaction data, according to some implementations.

FIG. 6 illustrates a block diagram 600 of an analysis module 124, according to some implementations. The analysis module 124 may include an event detection module 602. The event detection model 602 may accept as input one or more of item data 126, weight data 114, capacitance data 116, image data 118, or other sensor data. The event detection module 602 is configured to generate event data 506. The event data 506 may comprise information indicative of a change deemed to be significant that is associated with an inventory location or portion thereof. For example, the event data 506 may be indicative of a determination by a capacitive sensor 112(2) of proximity of an object, such as an item 106 or user 108. In another example, the event data 506 may comprise an indication that a weight change has exceeded a threshold value. In yet another example, the event data 506 may indicate that motion between a plurality of images has been detected that exceeds a threshold value. The event detection module 602 may utilize one or more filter functions, comparison functions, and so forth, to determine the event data 506. For example, the event data 506 may result from a determination that the capacitance data 116 and weight data 114 have each experienced changes that exceed a threshold value. The event detection module 602 may utilize various rules or conditions to determine the occurrence of an event and subsequent generation of event data 506.

The analysis module 124 may include or access the data processing module 604. The data processing module 604 may be configured to perform one or more data processing functions. The data processing functions may include, but are not limited to, filtering, noise reduction, signal recovery, determination of a moving average, statistical analysis, and so forth. The data processing module 604 may accept as input sensor data including, but not limited to, the weight data 114, the capacitance data 116, the image data 118, and so forth. The data processing module 604 may also accept as input event data 506. In one implementation, the data processing module 604 may utilize the event data 506 to apply particular data processing functions to specific data or portions thereof. For example, the event data 506 may indicate presence of an object based on a variation in the capacitance data 116. The event data 506 may be associated with a particular time. The data processing module 604 may access a set of the weight data 114 that was obtained before and after the particular time. The data processing module 604 may apply one or more noise filters or other data processing functions to determine a baseline weight corresponding to the weight before the particular time of the event data 506 and an event weight corresponding to the weight occurring after the particular time.

In some implementations, the data processing module 604 may be configured to determine or access previously determined noise profile data 606. For example, a particular sensor may produce characteristic noise even when no gross changes are taking place. For example, the weight sensor 112(1) may be prone to generating noise as a result of vibrations in the ambient environment resulting from passing traffic, users 108 moving nearby, jostling of the inventory location, and so forth. The data processing module 604 may use the event data 506 to determine when an intentional interaction with the inventory location has taken place, or determine when no intentional interaction with the inventory location appears to be taking place. For example, sensor data acquired during a period of time prior to the timestamp indicated by the event data 506 may be accessed. The sensor data may be processed to generate noise profile data 606. The noise profile data 606 may be generated by processing weight values obtained from the weight sensor 112(1) using one or more functions. For example, statistical functions such as an average, moving average, regression analysis, curve fitting, and so forth, may be used to generate the noise profile data 606. Other functions such as a spectral analysis, frequency domain analysis, time domain analysis, and so forth, may be used to generate the noise profile data 606. The noise profile data 606 may thus provide information indicative of the noise that is typically expected from the sensor. Once generated, subsequent data associated with the event indicated by the event data 506 may be processed to remove noise consistent with that described in the noise profile data 606. Continuing the example, the noise profile data 606 may be subtracted from the data that occurs during the period associated with the event to produce output. In some implementations, the noise profile data 606 may be updated based on weight data 114 that continues to be received, with the noise profile data 606 being defined as weight values obtained before the time associated with the event data 506.

The data processing module 604 may be configured to generate processed data, such as processed weight data 608, processed capacitance data 610, and so forth. The processed weight data 608 may comprise a baseline weight corresponding to the weight occurring before the particular time of the event data 506. The processed weight data 608 may also include an event weight corresponding to the weight occurring after the particular time. The processed capacitance data 610 may comprise a first capacitance value corresponding to a capacitance occurring before the particular time of an event 506 and a second capacitance value corresponding to a capacitance occurring after the particular time. In some implementations, the processed capacitance data 610 may result from the application of one or more statistical techniques, noise reduction, or signal recovery functions to the capacitance data 116. In some implementations, the processed capacitance data 610 may comprise a baseline capacitance value that is calculated from capacitance values gathered during times when no events were detected. For example, based on the sensor data such as the weight data 114 and the image data 118 being indicative of no active events taking place at the inventory location from a first time to a second time, the capacitance data 116 obtained during that interval may be used to calculate a baseline capacitance value. The baseline capacitance value may then be used to generate threshold data, by the interaction data module 616 for analysis, and so forth.

The data processing module 604 may also accept as input other sensor data 612, such as input from a light sensor, accelerometer, RF receiver, and so forth. The data processing module 604 may process the other sensor data 612 to provide other processed sensor data 614. For example, the image data 118 may be processed to generate information indicative of changes between images, object recognition data, and so forth.

Processing of one or more of the image data 118 or portions thereof may be performed by implementing, at least in part, one or more of the following tools or techniques. In one implementation, processing of the image data 118 may be performed, at least in part, using one or more tools available in the OpenCV library as developed by Intel Corporation of Santa Clara, Calif., USA; Willow Garage of Menlo Park, Calif., USA; and Itseez of Nizhny Novgorod, Russia, with information available at www.opencv.org. In another implementation, functions available in the OKAO machine vision library as promulgated by Omron Corporation of Kyoto, Japan, may be used to process the image data 118. In still another implementation, functions such as those in the Machine Vision Toolbox for Matlab (MVTB) available using MATLAB as developed by MathWorks, Inc. of Natick, Mass., USA, may be utilized.

An interaction data module 616 may be configured to use as input one or more of the item data 126, sensor data, processed data, and so forth, to generate the interaction data 128. The interaction data module 616 may include a location estimation module 618. The location estimation module 618 may be configured to use one or more of the processed weight data 608, the processed capacitance data 610, or the other processed sensor data 614 to determine location data 620 associated with an interaction. In some implementations, the location estimation module 618 may use unprocessed data, such as the weight data 114, capacitance data 116, image data 118, and so forth.

The location estimation module 618 may also use the item data 126 to determine the location data 620. For example, the item data 126 associated with a particular type of item 106 may be retrieved, providing information such as a width and depth, measured capacitance of a representative sample of the type of item 106, and so forth. The location estimation module 618 may use information such as the width and depth to determine an area that item 106 is expected to cover. Based on this information, the location information module 618 may avoid generating location data 620 that places the item 106 in the middle of a divider or some other unlikely location. For example, an item area associated with the item 106 may be determined by multiplying the width and depth indicated by the item data 126. An inventory area designated for stowage of items 106 is determined that is associated with the inventory location 712. For example, lane 104(1) may be indicated in the physical layout data as having a particular location in the facility 702 and a particular width and depth. The location estimation module 618 may determine location data 620 indicative of a center of the item area for the type of item 106 such that the item area is arranged within the inventory area. Continuing the example, the location estimation module 618 may be configured to avoid generating location data 620 that would place an item halfway off the shelf 102, or spanning a divider between lanes 104.

The location data 620 may provide information indicative of a particular location with regard to an inventory location. For example, the location data 620 may indicate a particular lane 104, portion of a lane 104, coordinates of the point or area on the shelf 102, and so forth. The interaction may comprise movement, presence, pick, place, and so forth, of an object or an item 106.

In one implementation, the location estimation module 618 may use the processed capacitance data 610 obtained from the array of capacitive sensors 112(2) on the shelf 102 to determine that there was a change made to the items 106 at a given lane 104. For example, the estimated location may be coarse, such as an area corresponding to a single conductive element 206 indicated by the capacitance data 116. In another example, the capacitance data 116 from a plurality of conductive elements 206 in a known configuration, such as depicted in layouts 302-312, may be used to generate the location data 620. The interaction data module 616 may access the item data 126 to determine the type of item 106 stored at the lane 104(1), and other characteristics about that type of item 106 such as a per item weight.

The interaction data module 616 may use other modules (not shown) to determine a quantity. For example, the processed weight data 608 may be used to determine a weight change value, and this weight change value may be compared with the per item weight to determine a quantity of items 106 that have changed. A sign of the weight change may be used to indicate addition or removal of an item 106. For example, a positive weight change value may indicate an increase in weight indicative of placement of an item 106 at an inventory location, while a negative weight change value may indicate a decrease in the weight indicative of pick of an item 106 from the inventory location. The interaction data module 616 may thus generate interaction data 128. For example, the interaction data 128 may indicate a quantity and type of item 106 that was removed from a particular inventory location.

In some implementations, several different types of location data 620 may be generated that correspond to the same event. For example, location data 620 may be determined based on the processed weight data 608, from the image data 118, and so forth. These different types of location data 620 may be compared, merged, or otherwise processed to determine an overall estimated location corresponding to the interaction.

Returning to the location estimation module 618, a variety of techniques may be used to determine an estimated location of an object that has been introduced to or removed from the volume in which the capacitive sensor 112(2) is able to detect. As the number of capacitive sensors 112(2), or the corresponding conductive elements 206 that are measured to determine capacitance, in a given area increase, the ability to more precisely resolve a location is improved. For example, an object such as a hand of the user 108 that is hovering above the shelf 102 may be detected by several different capacitive sensors 112(2), each reporting a respective capacitance value that is expressed in the capacitance data 116. By analyzing the capacitance data 116, location estimation module 618 may generate location data 620 that is indicative of the location of the hand of the user 108.

In some situations, more than one user 108 may pick or place items 106 contemporaneously. For example, a first user 108(1) may remove first item 106(1) from first lane 104(1) while a second user 108(2) removes second item 106(2) from second lane 104(2) at about the same time. First estimated location data 620(1) may be determined for the first user 108(1) and second estimated location data 620(2) may be determined for the second user 108(2). As described above, the estimated location data 620 may be based at least in part on the capacitance data 116. The weight data 114 may be processed to determine a change in center of weight (or center of mass). By using the first estimated location data 620(1) and the second estimated location data 620(2), weight changes associated with each of the interactions may be determined. For example, given the calculated weight of items 106 stowed at the first lane 104(1) and the second lane 104(2) and the known dimensions for these locations, various hypotheses involving quantities of items 106 as potentially taken by the first user 108(1) and the second user 108(2) may be compared. A hypothesis that is deemed to most closely match the weight data 114 obtained may then be used to specify the corresponding weight change and quantities associated with each interaction.

In another implementation, the location data 620 may be used to apportion the weight change associated with a change in center of weight. Continuing the example above, the center of weight may be split into a plurality of possible weight changes based on the estimated location data 620. If the total change in weight is 700 grams, and the center of weight is located at the intersection of the first lane 104(1) and the second lane 104(2), 350 grams may be designated as associated with the first user 108(1) and 350 grams may be designated as associated with the second user 108(2).

During operation, the interaction data module 616 or other modules associated therewith such as location estimation module 618 may generate calibration data 622. The calibration data 622 may comprise information that indicates a divergence between an estimated or determined value and another value that was either determined by a different sensor, by a different data processing mechanism, human input, and so forth. For example, location estimation module 618 may generate first location data 620(1) using the processed capacitance data 610. An image processing module (not shown) may use the image data 118 to determine a second location data 620(2) using the image data 118. The second location data 620(2) may be determined to be more accurate or definitive of the actual location associated with the interaction, and calibration data 622 may be generated that is based on the difference between the first location data 620(1) and the second location at 620(2). As a result, subsequent operation of a location estimation module 618 may utilize the calibration data 622 during the subsequent determination of location data 620.

In one implementation, a ratio or comparison between the capacitance values obtained using two adjacent conductive elements 206 may be indicative of a relative location of an object with respect to those conductive elements 206. For example if the first conductive element 206(1) is on the left and the second conductive element 206(2) is on the right, if a capacitance change value of the left is 27 microfarads and the capacitance change value of the right is 2 microfarads, the location data 620 may indicate that the object is closer to the first conductive element 206(1). In another implementation, the capacitance values or a ratio based on the capacitance values may be used to lookup a relative location associated with those values.

As the number of capacitive sensors 112(2) are increased, other techniques may be used to process the capacitance data 116 to determine a location. For example, the data may be processed using a minimum mean square error (MMSE) estimator, a Kalman filter or linear quadratic estimation, and so forth.

Figure 7:
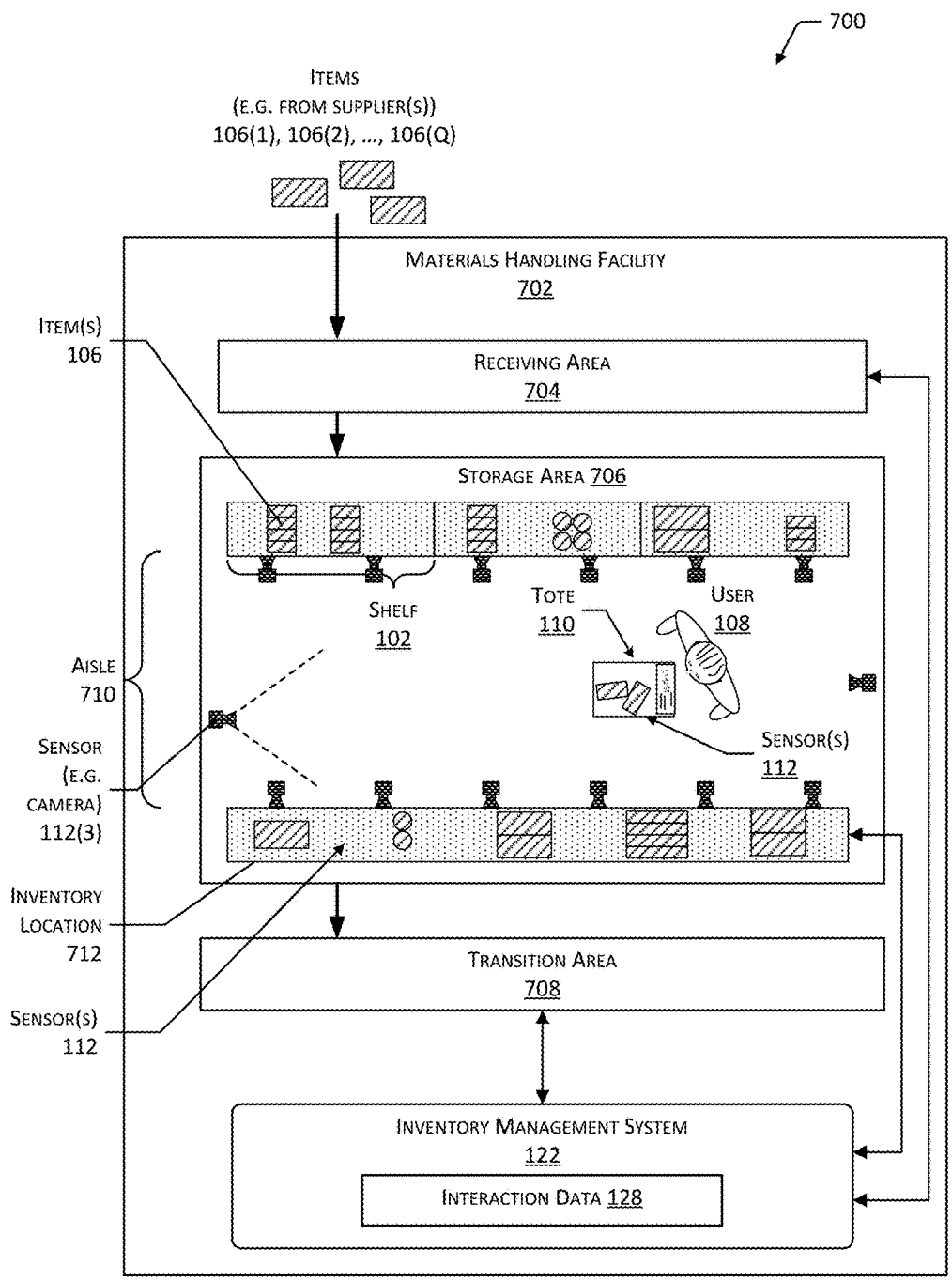
FIG. 7 is a block diagram illustrating a materials handling facility (facility) using the system, according to some implementations.

FIG. 7 is a block diagram 700 illustrating a materials handling facility (facility) 702 using the system 100, according to some implementations. A facility 702 comprises one or more physical structures or areas within which one or more items 106(1), 106(2), . . . , 106(Q) may be held. As used in this disclosure, letters in parenthesis such as "(Q)" indicate an integer value greater than or equal to zero. The items 106 may comprise physical goods, such as books, pharmaceuticals, repair parts, electronic gear, and so forth.

The facility 702 may include one or more areas designated for different functions with regard to inventory handling. In this illustration, the facility 702 includes a receiving area 704, a storage area 706, and a transition area 708.

The receiving area 704 may be configured to accept items 106, such as from suppliers, for intake into the facility 702. For example, the receiving area 704 may include a loading dock at which trucks or other freight conveyances unload the items 106. In some implementations, the items 106 may be processed, such as at the receiving area 704, to generate at least a portion of the item data 126. For example, an item 106 may be imaged or otherwise scanned to develop reference images or representations of the item 106 at the receiving area 704.

The storage area 706 is configured to store the items 106. The storage area 706 may be arranged in various physical configurations. In one implementation, the storage area 706 may include one or more aisles 710. The aisle 710 may be configured with, or defined by, inventory locations 712 on one or both sides of the aisle 710. The inventory locations 712 may include one or more of a shelf 102, a rack, a case, a cabinet, a bin, a floor location, or other suitable storage mechanisms for holding, supporting, or storing the items 106. For example, the inventory locations 712 may comprise shelves 102 with lanes 104 designated therein. The inventory locations 712 may be affixed to the floor or another portion of the structure of the facility 702. The inventory locations 712 may also be movable such that the arrangements of aisles 710 may be reconfigurable. In some implementations, the inventory locations 712 may be configured to move independently of an outside operator. For example, the inventory locations 712 may comprise a rack with a power source and a motor, operable by a computing device to allow the rack to move from one location within the facility 702 to another.

One or more users 108(1), 108(2), . . . , 108(U) and totes 110(1), 110(2), . . . , 110(T) or other material handling apparatus may move within the facility 702. For example, the user 108 may move about within the facility 702 to pick or place the items 106 in various inventory locations 712, placing them on the tote 110 for ease of transport. The tote 110 is configured to carry or otherwise transport one or more items 106. For example, the tote 110 may include a basket, cart, bag, bin, and so forth. In other implementations, other material handling apparatuses such as robots, forklifts, cranes, aerial drones, and so forth, may move about the facility 702 picking, placing, or otherwise moving the items 106. For example, a robot may pick an item 106 from a first inventory location 712(1) and move the item 106 to a second inventory location 712(2).

One or more sensors 112 may be configured to acquire information in the facility 702. The sensors 112 may include, but are not limited to, weight sensors 112(1), capacitive sensors 112(2), image sensors 112(3), depth sensors 112(4), and so forth. The sensors 112 may be stationary or mobile, relative to the facility 702. For example, the inventory locations 712 may contain weight sensors 112(1) to acquire weight sensor data of items 106 stowed therein, image sensors 112(3) to acquire images of picking or placement of items 106 on shelves 102, optical sensor arrays 112(14) to detect shadows of the user's 108 hands at the inventory locations 712, and so forth. In another example, the facility 702 may include image sensors 112(3) to obtain images of the user 108 or other objects in the facility 702. The sensors 112 are discussed in more detail below with regard to FIG. 8.

While the storage area 706 is depicted as having one or more aisles 710, inventory locations 712 storing the items 106, sensors 112, and so forth, it is understood that the receiving area 704, the transition area 708, or other areas of the facility 702 may be similarly equipped. Furthermore, the arrangement of the various areas within the facility 702 is depicted functionally rather than schematically. For example, in some implementations, multiple different receiving areas 704, storage areas 706, and transition areas 708 may be interspersed rather than segregated in the facility 702.

The facility 702 may include, or be coupled to, the inventory management system 122. The inventory management system 122 is configured to interact with one or more of the users 108 or devices such as sensors 112, robots, material handling equipment, computing devices, and so forth, in one or more of the receiving area 704, the storage area 706, or the transition area 708.

During operation of the facility 702, the sensors 112 may be configured to provide sensor data, or information based on the sensor data, to the inventory management system 122. The sensor data may include the weight data 114, the capacitance data 116, the image data 118, and so forth. The sensors 112 are described in more detail below with regard to FIG. 8.

The inventory management system 122 or other systems may use the sensor data to track the location of objects within the facility 702, movement of the objects, or provide other functionality. Objects may include, but are not limited to, items 106, users 108, totes 110, and so forth. For example, a series of images acquired by the image sensor 112(3) may indicate removal by the user 108 of an item 106 from a particular location on the inventory location 712 and placement of the item 106 on or at least partially within the tote 110.

The facility 702 may be configured to receive different kinds of items 106 from various suppliers and to store them until a customer orders or retrieves one or more of the items 106. A general flow of items 106 through the facility 702 is indicated by the arrows of FIG. 7. Specifically, as illustrated in this example, items 106 may be received from one or more suppliers, such as manufacturers, distributors, wholesalers, and so forth, at the receiving area 704. In various implementations, the items 106 may include merchandise, commodities, perishables, or any suitable type of item 106, depending on the nature of the enterprise that operates the facility 702.

Upon being received from a supplier at the receiving area 704, the items 106 may be prepared for storage in the storage area 706. For example, in some implementations, items 106 may be unpacked or otherwise rearranged. The inventory management system 122 may include one or more software applications executing on a computer system to provide inventory management functions. These inventory management functions may include maintaining information indicative of the type, quantity, condition, cost, location, weight, or any other suitable parameters with respect to the items 106. The items 106 may be stocked, managed, or dispensed in terms of countable units, individual units, or multiple units, such as packages, cartons, crates, pallets, or other suitable aggregations. Alternatively, some items 106, such as bulk products, commodities, and so forth, may be stored in continuous or arbitrarily divisible amounts that may not be inherently organized into countable units. Such items 106 may be managed in terms of a measurable quantity such as units of length, area, volume, weight, time, duration, or other dimensional properties characterized by units of measurement. Generally speaking, a quantity of an item 106 may refer to either a countable number of individual or aggregate units of an item 106 or a measurable amount of an item 106, as appropriate.

After arriving through the receiving area 704, items 106 may be stored within the storage area 706. In some implementations, like items 106 may be stored or displayed together in the inventory locations 712 such as in bins, on shelves 104, hanging from pegboards, and so forth. In this implementation, all items 106 of a given kind are stored in one inventory location 712. In other implementations, like items 106 may be stored in different inventory locations 712. For example, to optimize retrieval of certain items 106 having frequent turnover within a large physical facility 702, those items 106 may be stored in several different inventory locations 712 to reduce congestion that might occur at a single inventory location 712.

When a customer order specifying one or more items 106 is received, or as a user 108 progresses through the facility 702, the corresponding items 106 may be selected or "picked" from the inventory locations 712 containing those items 106. In various implementations, item picking may range from manual to completely automated picking. For example, in one implementation, a user 108 may have a list of items 106 they desire and may progress through the facility 702 picking items 106 from inventory locations 712 within the storage area 706 and placing those items 106 into a tote 110. In other implementations, employees of the facility 702 may pick items 106 using written or electronic pick lists derived from customer orders. These picked items 106 may be placed into the tote 110 as the employee progresses through the facility 702.

After items 106 have been picked, the items 106 may be processed at a transition area 708. The transition area 708 may be any designated area within the facility 702 where items 106 are transitioned from one location to another or from one entity to another. For example, the transition area 708 may be a packing station within the facility 702. When the item 106 arrives at the transition area 708, the items 106 may be transitioned from the storage area 706 to the packing station. Information about the transition may be maintained by the inventory management system 122.

In another example, if the items 106 are departing the facility 702, a list of the items 106 may be obtained and used by the inventory management system 122 to transition responsibility for, or custody of, the items 106 from the facility 702 to another entity. For example, a carrier may accept the items 106 for transport with that carrier accepting responsibility for the items 106 indicated in the list. In another example, a user 108 may purchase or rent the items 106 and remove the items 106 from the facility 702. During use of the facility 702, the user 108 may move about the facility 702 to perform various tasks, such as picking or placing the items 106 in the inventory locations 712.

The interaction data 128 may provide information about an interaction, such as a pick of an item 106 from the inventory location 712, a place of an item 106 to the inventory location 712, a touch made to an item 106 at the inventory location 712, a gesture associated with an item 106 at the inventory location 712, and so forth. The interaction data 128 may include one or more of the type of interaction, interaction location identifier indicative of where from the inventory location 712 the interaction took place, item identifier, quantity change to the item 106, user identifier, and so forth. The interaction data 128 may then be used to further update the item data 126. For example, the quantity of items 106 on hand at a particular lane 104 on the shelf 102 may be changed based on an interaction that picks or places one or more items 106.

The inventory management system 122 may combine or otherwise utilize data from different sensors 112 of different types. For example, weight data 114 obtained from weight sensors 112(1) at the inventory location 712 may be used instead of, or in conjunction with, one or more of the capacitance data 116 to determine the interaction data 128.

Figure 8:
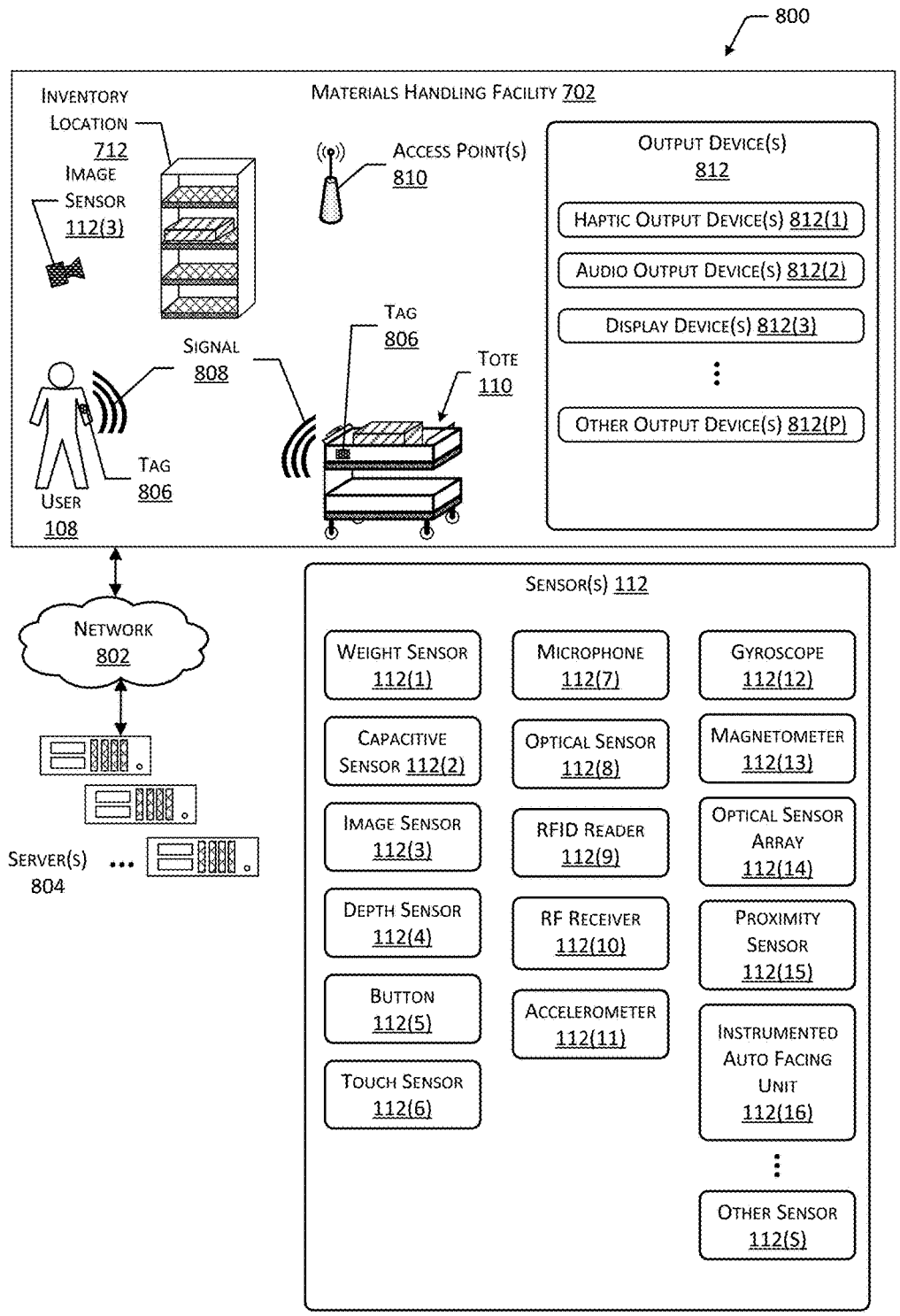
FIG. 8 is a block diagram illustrating additional details of the facility, according to some implementations.

FIG. 8 is a block diagram 800 illustrating additional details of the facility 702, according to some implementations. The facility 702 may be connected to one or more networks 802, which in turn connect to one or more servers 804. The network 802 may include private networks such as an institutional or personal intranet, public networks such as the Internet, or a combination thereof. The network 802 may utilize wired technologies (e.g., wires, fiber optic cables, and so forth), wireless technologies (e.g., radio frequency, infrared, acoustic, optical, and so forth), or other connection technologies. The network 802 is representative of any type of communication network, including one or more of data networks or voice networks. The network 802 may be implemented using wired infrastructure (e.g., copper cable, fiber optic cable, and so forth), a wireless infrastructure (e.g., cellular, microwave, satellite, and so forth), or other connection technologies.

The servers 804 may be configured to execute one or more modules or software applications associated with the inventory management system 122 or other systems. While the servers 804 are illustrated as being in a location outside of the facility 702, in other implementations, at least a portion of the servers 804 may be located at the facility 702. The servers 804 are discussed in more detail below with regard to FIG. 9.

The users 108, the totes 110, or other objects in the facility 702 may be equipped with one or more tags 806. The tags 806 may be configured to emit a signal 808. In one implementation, the tag 806 may be a RFID tag 806 configured to emit a RF signal 808 upon activation by an external signal. For example, the external signal may comprise a radio frequency signal or a magnetic field configured to energize or activate the RFID tag 806. In another implementation, the tag 806 may comprise a transmitter and a power source configured to power the transmitter. For example, the tag 806 may comprise a Bluetooth Low Energy (BLE) transmitter and battery. In other implementations, the tag 806 may use other techniques to indicate presence of the tag 806. For example, an acoustic tag 806 may be configured to generate an ultrasonic signal 808, which is detected by corresponding acoustic receivers. In yet another implementation, the tag 806 may be configured to emit an optical signal 808.

The inventory management system 122 may be configured to use the tags 806 for one or more of identification of the object, determining a location of the object, and so forth. For example, the users 108 may wear tags 806, the totes 110 may have tags 806 affixed, and so forth, which may be read and, based at least in part on signal strength, used to determine identity and location.

Generally, the inventory management system 122 or other systems associated with the facility 702 may include any number and combination of input components, output components, and servers 804.

The one or more sensors 112 may be arranged at one or more locations within the facility 702. For example, the sensors 112 may be mounted on or within a floor, wall, at a ceiling, at an inventory location 712, on a tote 110, may be carried or worn by a user 108, and so forth.

The sensors 112 may include one or more weight sensors 112(1) that are configured to measure the weight of a load, such as the item 106, the tote 110, or other objects. The weight sensors 112(1) may be configured to measure the weight of the load at one or more of the inventory locations 712, the tote 110, on the floor of the facility 702, and so forth. For example, the shelf 102 may include a plurality of lanes 104 or platforms, with one or more weight sensors 112(1) beneath each one to provide weight sensor data about an individual lane 104 or platform. The weight sensors 112(1) may include one or more sensing mechanisms to determine the weight of a load. These sensing mechanisms may include piezoresistive devices, piezoelectric devices, capacitive devices, electromagnetic devices, optical devices, potentiometric devices, microelectromechanical devices, and so forth. The sensing mechanisms of weight sensors 112(1) may operate as transducers that generate one or more signals based on an applied force, such as that of the load due to gravity. For example, the weight sensor 112(1) may comprise a load cell having a strain gauge and a structural member that deforms slightly when weight is applied. By measuring a change in the electrical characteristic of the strain gauge, such as capacitance or resistance, the weight may be determined. In another example, the weight sensor 112(1) may comprise a force sensing resistor (FSR). The FSR may comprise a resilient material that changes one or more electrical characteristics when compressed. For example, the electrical resistance of a particular portion of the FSR may decrease as the particular portion is compressed. The inventory management system 122 may use the data acquired by the weight sensors 112(1) to identify an object, determine a change in the quantity of objects, determine a location of an object, maintain shipping records, and so forth.

The sensors 112 may include capacitive sensors 112(2). As described above with regard to FIG. 2, the capacitive sensor 112(2) may comprise one or more conductive elements 206 and the capacitive sensor module 212. In some implementations, the capacitive sensor 112(2) may include or utilize a switch module 210. The capacitive sensor 112(2) may be configured to use a far-field capacitance effect that may comprise measuring the self-capacitance of the conductive elements 206, rather than a mutual capacitance. In one implementation, a fixed charge may be provided to the conductive element 206, and the resultant voltage may be measured between the conductive element 206 and the ground.

In other implementations, the capacitive sensor 112(2) may be configured to operate in a mutual capacitance mode, surface capacitance mode, and so forth. In mutual capacitance mode, at least two conductive layers are arranged in a stack with a dielectric material between the layers. The dielectric may be a solid, such as a plastic, a gas such as air, a vacuum, and so forth. The mutual capacitance at points between these layers is measured. When another object touches the outermost conductive layer, the mutual capacitance between the two layers changes, allowing for detection. In surface capacitance mode, voltages are applied to different points of a conductive element 206 to produce an electrostatic field. By measuring the changes in current draw (or another electrical characteristic) from the different points at which voltage is applied, a location of an object may be determined.

The sensors 112 may include one or more image sensors 112(3). The one or more image sensors 112(3) may include imaging sensors configured to acquire images of a scene. The image sensors 112(3) are configured to detect light in one or more wavelengths including, but not limited to, terahertz, infrared, visible, ultraviolet, and so forth. The image sensors 112(3) may comprise charge coupled devices (CCD), complementary metal oxide semiconductor (CMOS) devices, microbolometers, and so forth. The inventory management system 122 may use image data 118 acquired by the image sensors 112(3) during operation of the facility 702. For example, the inventory management system 122 may identify items 106, users 108, totes 110, and so forth, based at least in part on their appearance within the image data 118 acquired by the image sensors 112(3). The image sensors 112(3) may be mounted in various locations within the facility 702. For example, image sensors 112(3) may be mounted overhead, on inventory locations 712, may be worn or carried by users 108, may be affixed to totes 110, and so forth.

One or more depth sensors 112(4) may also be included in the sensors 112. The depth sensors 112(4) are configured to acquire spatial or three-dimensional (3D) data, such as depth information, about objects within a FOV 120. The depth sensors 112(4) may include range cameras, lidar systems, sonar systems, radar systems, structured light systems, stereo vision systems, optical interferometry systems, and so forth. The inventory management system 122 may use the 3D data acquired by the depth sensors 112(4) to identify objects, determine a location of an object in 3D real space, and so forth.

One or more buttons 112(5) may be configured to accept input from the user 108. The buttons 112(5) may comprise mechanical, capacitive, optical, or other mechanisms. For example, the buttons 112(5) may comprise mechanical switches configured to accept an applied force from a touch of the user 108 to generate an input signal. The inventory management system 122 may use data from the buttons 112(5) to receive information from the user 108. For example, the tote 110 may be configured with a button 112(5) to accept input from the user 108 and send information indicative of the input to the inventory management system 122.

The sensors 112 may include one or more touch sensors 112(6). The touch sensors 112(6) may use resistive, capacitive, surface capacitance, projected capacitance, mutual capacitance, optical, Interpolating Force-Sensitive Resistance (IFSR), or other mechanisms to determine the position of a touch or near-touch. For example, the IFSR may comprise a material configured to change electrical resistance responsive to an applied force. The location within the material of that change in electrical resistance may indicate the position of the touch. The inventory management system 122 may use data from the touch sensors 112(6) to receive information from the user 108. For example, the touch sensor 112(6) may be integrated with the tote 110 to provide a touchscreen with which the user 108 may select from a menu one or more particular items 106 for picking, enter a manual count of items 106 at an inventory location 712, and so forth.

One or more microphones 112(7) may be configured to acquire information indicative of sound present in the environment. In some implementations, arrays of microphones 112(7) may be used. These arrays may implement beamforming techniques to provide for directionality of gain. The inventory management system 122 may use the one or more microphones 112(7) to acquire information from acoustic tags 806, accept voice input from the users 108, determine ambient noise level, and so forth.

The sensors 112 may include one or more optical sensors 112(8). The optical sensors 112(8) may be configured to provide data indicative of one or more of color or intensity of light impinging thereupon. For example, the optical sensor 112(8) may comprise a photodiode and associated circuitry configured to generate a signal or data indicative of an incident flux of photons. As described below, the optical sensor array 112(14) may comprise a plurality of the optical sensors 112(8). For example, the optical sensor 112(8) may comprise an array of ambient light sensors such as the ISL76683 as provided by Intersil Corporation of Milpitas, Calif., USA, or the MAX44009 as provided by Maxim Integrated of San Jose, Calif., USA. In other implementations, other optical sensors 112(8) may be used. The optical sensors 112(8) may be sensitive to one or more of infrared light, visible light, or ultraviolet light. For example, the optical sensors 112(8) may be sensitive to infrared light, and infrared light sources such as light emitting diodes (LEDs) may provide illumination.

The optical sensors 112(8) may include photodiodes, photoresistors, photovoltaic cells, quantum dot photoconductors, bolometers, pyroelectric infrared detectors, and so forth. For example, the optical sensor 112(8) may use germanium photodiodes to detect infrared light.

One or more radio frequency identification (RFID) readers 112(9), near field communication (NFC) systems, and so forth, may be included as sensors 112. For example, the RFID readers 112(9) may be configured to read the RF tags 806. Information acquired by the RFID reader 112(9) may be used by the inventory management system 122 to identify an object associated with the RF tag 806 such as the item 106, the user 108, the tote 110, and so forth. For example, based on information from the RFID readers 112(9) detecting the RF tag 806 at different times and RFID readers 112(9) having different locations in the facility 702, a velocity of the RF tag 806 may be determined.

One or more RF receivers 112(10) may also be included as sensors 112. In some implementations, the RF receivers 112(10) may be part of transceiver assemblies. The RF receivers 112(10) may be configured to acquire RF signals 808 associated with Wi-Fi, Bluetooth, ZigBee, 4G, 3G, LTE, or other wireless data transmission technologies. The RF receivers 112(10) may provide information associated with data transmitted via radio frequencies, signal strength of RF signals 808, and so forth. For example, information from the RF receivers 112(10) may be used by the inventory management system 122 to determine a location of an RF source, such as a communication interface onboard the tote 110.

The sensors 112 may include one or more accelerometers 112(11), which may be worn or carried by the user 108, mounted to the tote 110, and so forth. The accelerometers 112(11) may provide information such as the direction and magnitude of an imposed acceleration. Data such as rate of acceleration, determination of changes in direction, speed, and so forth, may be determined using the accelerometers 112(11).

A gyroscope 112(12) may provide information indicative of rotation of an object affixed thereto. For example, the tote 110 or other objects may be equipped with a gyroscope 112(12) to provide data indicative of a change in orientation of the object.

A magnetometer 112(13) may be used to determine an orientation by measuring ambient magnetic fields, such as the terrestrial magnetic field. The magnetometer 112(13) may be worn or carried by the user 108, mounted to the tote 110, and so forth. For example, the magnetometer 112(13) mounted to the tote 110 may act as a compass and provide information indicative of which direction the tote 110 is oriented.

An optical sensor array 112(14) may comprise one or more optical sensors 112(8). The optical sensors 112(8) may be arranged in a regular, repeating, or periodic two-dimensional arrangement such as a grid. The optical sensor array 112(14) may generate image data 118. For example, the optical sensor array 112(14) may be arranged within or below an inventory location 712 and obtain information about shadows of items 106, hand of the user 108, and so forth.

The sensors 112 may include proximity sensors 112(15) used to determine presence of an object, such as the user 108, the tote 110, and so forth. The proximity sensors 112(15) may use optical, electrical, ultrasonic, electromagnetic, or other techniques to determine a presence of an object. In some implementations, the proximity sensors 112(15) may use an optical emitter and an optical detector to determine proximity. For example, an optical emitter may emit light, a portion of which may then be reflected by the object back to the optical detector to provide an indication that the object is proximate to the proximity sensor 112(15). In other implementations, the proximity sensors 112(15) may comprise a capacitive proximity sensor 112(15) configured to provide an electrical field and determine a change in electrical capacitance due to presence or absence of an object within the electrical field.

The proximity sensors 112(15) may be configured to provide sensor data indicative of one or more of a presence or absence of an object, a distance to the object, or characteristics of the object. An optical proximity sensor 112(15) may use time-of-flight (ToF), structured light, interferometry, or other techniques to generate the distance data. For example, ToF determines a propagation time (or "round-trip" time) of a pulse of emitted light from an optical emitter or illuminator that is reflected or otherwise returned to an optical detector. By dividing the propagation time in half and multiplying the result by the speed of light in air, the distance to an object may be determined. In another implementation, a structured light pattern may be provided by the optical emitter. A portion of the structured light pattern may then be detected on the object using a sensor 112 such as an image sensor 112(3). Based on an apparent distance between the features of the structured light pattern, the distance to the object may be calculated. Other techniques may also be used to determine distance to the object. In another example, the color of the reflected light may be used to characterize the object, such as skin, clothing, tote 110, and so forth.

The sensors 112 may also include an instrumented autofacing unit (IAFU) 112(16). The IAFU 112(16) may comprise a position sensor configured to provide data indicative of displacement of a pusher. As an item 106 is removed from the IAFU 112(16), the pusher moves, such as under the influence of a spring, and pushes the remaining items 106 in the IAFU 112(16) to the front of the inventory location 712. By using data from the position sensor, and given item data 126 such as a depth of an individual item 106, a count may be determined, based on a change in position data. For example, if each item 106 is 1 inch deep, and the position data indicates a change of 8 inches, the quantity held by the IAFU 112(16) may have changed by 8 items 106. This count information may be used to confirm or provide a cross check for a count obtained by other means, such as analysis of the weight data 114, the capacitance data 116, the image data 118, and so forth.

The sensors 112 may include other sensors 112(S) as well. For example, the other sensors 112(S) may include light curtains, ultrasonic rangefinders, thermometers, barometric sensors, air pressure sensors, hygrometers, and so forth. For example, the inventory management system 122 may use information acquired from thermometers and hygrometers in the facility 702 to direct the user 108 to check on delicate items 106 stored in a particular inventory location 712, which is overheating, too dry, too damp, and so forth.

In one implementation, a light curtain may utilize a linear array of light emitters and a corresponding linear array of light detectors. For example, the light emitters may comprise a line of infrared LEDs or vertical cavity surface emitting lasers (VCSELs) that are arranged above a top shelf 102 in front of the inventory location 712, while the light detectors comprise a line of photodiodes sensitive to infrared light arranged below the light emitters. The light emitters produce a "lightplane" or sheet of infrared light that is then detected by the light detectors. An object passing through the lightplane may decrease the amount of light falling upon the light detectors. For example, the user's 108 hand would prevent at least some of the light from light emitters from reaching a corresponding light detector. As a result, a position along the linear array of the object may be determined that is indicative of a touchpoint. This position may be expressed as touchpoint data, with the touchpoint being indicative of the intersection between the hand of the user 108 and the sheet of infrared light. In some implementations, a pair of light curtains may be arranged at right angles relative to one another to provide two-dimensional touchpoint data indicative of a position of touch in a plane. Input from the light curtain, such as indicating occlusion from a hand of a user 108 may be used to generate event data 506.

In some implementations, the image sensor 112(3) or other sensors 112(S) may include hardware processors, memory, and other elements configured to perform various functions. For example, the image sensors 112(3) may be configured to generate image data 118, send the image data 118 to another device such as the server 804, and so forth.

The facility 702 may include one or more access points 810 configured to establish one or more wireless networks. The access points 810 may use Wi-Fi, NFC, Bluetooth, or other technologies to establish wireless communications between a device and the network 802. The wireless networks allow the devices to communicate with one or more of the sensors 112, the inventory management system 122, the optical sensor arrays 112(14), the tag 806, a communication device of the tote 110, or other devices.

Output devices 812 may also be provided in the facility 702. The output devices 812 are configured to generate signals, which may be perceived by the user 108 or detected by the sensors 112. In some implementations, the output devices 812 may be used to provide illumination of the optical sensor array 112(14).

Haptic output devices 812(1) are configured to provide a signal that results in a tactile sensation to the user 108. The haptic output devices 812(1) may use one or more mechanisms such as electrical stimulation or mechanical displacement to provide the signal. For example, the haptic output devices 812(1) may be configured to generate a modulated electrical signal, which produces an apparent tactile sensation in one or more fingers of the user 108. In another example, the haptic output devices 812(1) may comprise piezoelectric or rotary motor devices configured to provide a vibration, which may be felt by the user 108.

One or more audio output devices 812(2) may be configured to provide acoustic output. The acoustic output includes one or more of infrasonic sound, audible sound, or ultrasonic sound. The audio output devices 812(2) may use one or more mechanisms to generate the acoustic output. These mechanisms may include, but are not limited to, the following: voice coils, piezoelectric elements, magnetorestrictive elements, electrostatic elements, and so forth. For example, a piezoelectric buzzer or a speaker may be used to provide acoustic output.

The display devices 812(3) may be configured to provide output, which may be seen by the user 108 or detected by a light-sensitive sensor such as an image sensor 112(3) or an optical sensor 112(8). In some implementations, the display devices 812(3) may be configured to produce output in one or more of infrared, visible, or ultraviolet light. The output may be monochrome or in color. The display devices 812(3) may be one or more of emissive, reflective, microelectromechanical, and so forth. An emissive display device 812(3), such as using LEDs, is configured to emit light during operation. In comparison, a reflective display device 812(3), such as using an electrophoretic element, relies on ambient light to present an image. Backlights or front lights may be used to illuminate non-emissive display devices 812(3) to provide visibility of the output in conditions where the ambient light levels are low.

The display devices 812(3) may be located at various points within the facility 702. For example, the addressable displays may be located on inventory locations 712, totes 110, on the floor of the facility 702, and so forth.

Other output devices 812(P) may also be present. For example, the other output devices 812(P) may include scent/odor dispensers, document printers, 3D printers or fabrication equipment, and so forth.

Figure 9:
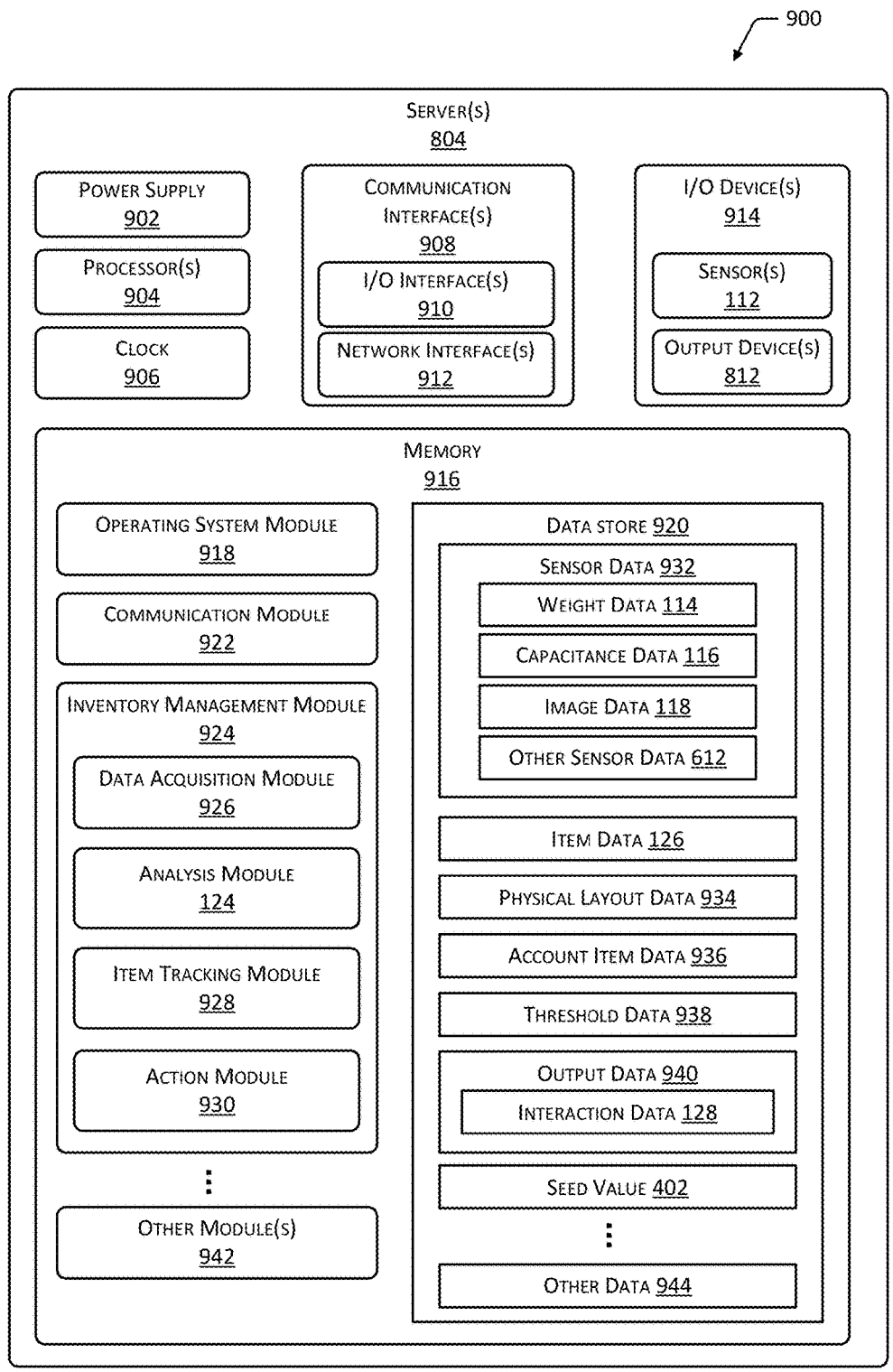
FIG. 9 is a block diagram of a server to support operation of the facility, according to some implementations.

FIG. 9 illustrates a block diagram 900 of a server 804 configured to support operation of the facility 702, according to some implementations. The server 804 may be physically present at the facility 702, may be accessible by the network 802, or a combination of both. The server 804 does not require end-user knowledge of the physical location and configuration of the system that delivers the services. Common expressions associated with the server 804 may include "on-demand computing", "software as a service (SaaS)", "platform computing", "network-accessible platform", "cloud services", "data centers", and so forth. Services provided by the server 804 may be distributed across one or more physical or virtual devices.

One or more power supplies 902 may be configured to provide electrical power suitable for operating the components in the server 804. The one or more power supplies 902 may comprise batteries, capacitors, fuel cells, photovoltaic cells, wireless power receivers, conductive couplings suitable for attachment to an external power source such as provided by an electric utility, and so forth. The server 804 may include one or more hardware processors 904 (processors) configured to execute one or more stored instructions. The processors 904 may comprise one or more cores. One or more clocks 906 may provide information indicative of date, time, ticks, and so forth. For example, the processor 904 may use data from the clock 906 to associate a particular interaction with a particular point in time.

The server 804 may include one or more communication interfaces 908 such as input/output (I/O) interfaces 910, network interfaces 912, and so forth. The communication interfaces 908 enable the server 804, or components thereof, to communicate with other devices or components. The communication interfaces 908 may include one or more I/O interfaces 910. The I/O interfaces 910 may comprise Inter-Integrated Circuit (I2C), Serial Peripheral Interface bus (SPI), Universal Serial Bus (USB) as promulgated by the USB Implementers Forum, RS-232, and so forth.

The I/O interface(s) 910 may couple to one or more I/O devices 914. The I/O devices 914 may include input devices such as one or more of a sensor 112, keyboard, mouse, scanner, and so forth. The I/O devices 914 may also include output devices 812 such as one or more of a display device 812(3), printer, audio speakers, and so forth. In some embodiments, the I/O devices 914 may be physically incorporated with the server 804 or may be externally placed.

The network interfaces 912 may be configured to provide communications between the server 804 and other devices, such as the totes 110, routers, access points 810, and so forth. The network interfaces 912 may include devices configured to couple to personal area networks (PANs), local area networks (LANs), wireless local area networks (WLANS), wide area networks (WANs), and so forth. For example, the network interfaces 912 may include devices compatible with Ethernet, Wi-Fi, Bluetooth, ZigBee, and so forth.

The server 804 may also include one or more busses or other internal communications hardware or software that allow for the transfer of data between the various modules and components of the server 804.

As shown in FIG. 9, the server 804 includes one or more memories 916. The memory 916 may comprise one or more non-transitory computer-readable storage media (CRSM). The CRSM may be any one or more of an electronic storage medium, a magnetic storage medium, an optical storage medium, a quantum storage medium, a mechanical computer storage medium, and so forth. The memory 916 provides storage of computer-readable instructions, data structures, program modules, and other data for the operation of the server 804. A few example functional modules are shown stored in the memory 916, although the same functionality may alternatively be implemented in hardware, firmware, or as a system on a chip (SoC).

The memory 916 may include at least one operating system (OS) module 918. The OS module 918 is configured to manage hardware resource devices such as the I/O interfaces 910, the I/O devices 914, the communication interfaces 908, and provide various services to applications or modules executing on the processors 904. The OS module 918 may implement a variant of the FreeBSD operating system as promulgated by the FreeBSD Project; other UNIX or UNIX-like variants; a variation of the Linux operating system as promulgated by Linus Torvalds; the Windows operating system from Microsoft Corporation of Redmond, Wash., USA; and so forth.

Also stored in the memory 916 may be a data store 920 and one or more of the following modules. These modules may be executed as foreground applications, background tasks, daemons, and so forth. The data store 920 may use a flat file, database, linked list, tree, executable code, script, or other data structure to store information. In some implementations, the data store 920 or a portion of the data store 920 may be distributed across one or more other devices including the servers 804, network attached storage devices, and so forth.

A communication module 922 may be configured to establish communications with one or more of the totes 110, sensors 112, display devices 812(3), other servers 804, or other devices. The communications may be authenticated, encrypted, and so forth.

The memory 916 may store an inventory management module 924. The inventory management module 924 is configured to provide the inventory functions as described herein with regard to the inventory management system 122. For example, the inventory management module 924 may track items 106 between different inventory locations 712, to and from the totes 110, and so forth.

The inventory management module 924 may include one or more of a data acquisition module 926, the analysis module 124, an item tracking module 928, an action module 930, and so forth. The data acquisition module 926 may be configured to acquire and access information associated with operation of the facility 702. For example, the data acquisition module 926 may be configured to acquire sensor data 932 such as the weight data 114, capacitance data 116, image data 118, and so forth. The sensor data 932 may be accessed by the other modules for use.

As described above, the analysis module 124 may be configured to generate the interaction data 128 using the sensor data 932, item data 126, physical layout data 934, and so forth.

The item tracking module 928 may access physical layout data 934 and generate account item data 936. The item tracking module 928 may be configured to determine a location within the facility 702, a user 108, a user account, and so forth, that is associated with one or more items 106. For example, the item tracking module 928 may determine that an item 106 has been removed from lane 104(1) and placed into the tote 110. The item tracking module 928 may then determine that the tote 110 is associated with the user 108 or the user account that represents the user 108. The item tracking module 928 may also use the interaction data 128. For example, the interaction data 128 that is indicative of a particular type of item 106 being removed from a particular inventory location 712 may be used as part of the input to track the items 106 that are in the custody of a particular user 108.

The inventory management system 122 may utilize the physical layout data 934. The physical layout data 934 may provide information indicative of where sensors 112 and inventory locations 712 are in the facility 702 with respect to one another, FOV 120 of sensors 112 relative to the inventory location 712, and so forth. For example, the physical layout data 934 may comprise information representative of a map or floor plan of the facility 702 with relative positions of inventory locations 712, planogram data indicative of how items 106 are to be arranged at the inventory locations 712, and so forth.

The physical layout data 934 may associate a particular inventory location ID with other information such as physical location data, sensor position data, sensor direction data, sensor identifiers, and so forth. The physical location data provides information about where in the facility 702 objects are, such as the inventory location 712, the sensors 112, and so forth. In some implementations, the physical location data may be relative to another object. For example, the physical location data may indicate that a particular weight sensor 112(1), capacitive sensor 112(2), or image sensor 112(3) is associated with the lane 104(1).

The inventory management module 924 may utilize this information during operation. For example, the item tracking module 928 may utilize physical layout data 934 to determine what capacitance data 116 acquired from particular capacitive sensors 112(2) corresponds to a particular shelf 102, lane 104, or other inventory location 712.

The item tracking module 928 may access information from sensors 112 within the facility 702, such as those at the shelf 102 or other inventory location 712, onboard the tote 110 or carried by or worn by the user 108. For example, the item tracking module 928 may receive information from an RFID reader at the shelf 102 that is indicative of tags associated with each of the items 106 that are placed onto the shelf 102.

The account item data 936 may also be included in the data store 920 and comprises information indicative of one or more items 106 that are within the custody of a particular user 108, within a particular tote 110, and so forth. For example, the account item data 936 may comprise a list of the contents of the tote 110. Continuing the example, the list may be further associated with the user account representative of the user 108. In another example, the account item data 936 may comprise a list of items 106 that the user 108 is carrying. The item tracking module 928 may use the account item data 936 to determine subsets of possible items 106 with which the user 108 may have interacted.

The inventory management module 924, and modules associated therewith, may access sensor data 932, threshold data 938, and so forth. The threshold data 938 may comprise one or more thresholds, ranges, percentages, and so forth, that may be used by the various modules in operation. For example, the event detection module 602 may access threshold data 938 to determine event data 506. The threshold data 938 may be determined by analyzing sensor data 932 to determine the sensor values obtained when no event has been determined. For example, the capacitance data 116 obtained during a period of time in which no users 108 are present in the facility 702 may be used to generate a baseline capacitance value. A factor may be applied to the baseline capacitance value to determine a threshold capacitance value used to determine occurrence of an event. Continuing the example, the factor may be 20%, so the baseline capacitance value may be multiplied by 1.2 to produce the threshold value. A change in capacitance value that exceeds this threshold may thus result in the event detection module 602 generating event data 506 indicative of an event. The data processing module 604 may access threshold data 938 during the generation of processed data. The interaction data module 616 may access the threshold data 938 during the generation of the location data 620, the interaction data 128, and so forth.

The inventory management module 924 may generate output data 940. For example, the output data 940 may include the interaction data 128, inventory levels for individual types of items 106, overall inventory, and so forth.

The action module 930 may be configured to initiate or coordinate one or more actions responsive to output data 940. For example, the action module 930 may access output data 940 that indicates a particular inventory location 712 is empty and in need of restocking. An action such as a dispatch of a work order or transmitting instructions to a robot may be performed to facilitate restocking of the inventory location 712.

Processing sensor data 932, such as the image data 118, may be performed by a module implementing, at least in part, one or more of the following tools or techniques. In one implementation, processing of the image data 118 may be performed, at least in part, using one or more tools available in the OpenCV library as developed by Intel Corporation of Santa Clara, Calif., USA; Willow Garage of Menlo Park, Calif., USA; and Itseez of Nizhny Novgorod, Russia, with information available at www.opencv.org. In another implementation, functions available in the OKAO machine vision library as promulgated by Omron Corporation of Kyoto, Japan, may be used to process the sensor data 932. In still another implementation, functions such as those in the Machine Vision Toolbox for Matlab (MVTB) available using MATLAB as developed by MathWorks, Inc. of Natick, Mass., USA, may be utilized.

Techniques such as artificial neural networks (ANNs), active appearance models (AAMs), active shape models (ASMs), principal component analysis (PCA), cascade classifiers, and so forth, may also be used to process the sensor data 932 or other data. For example, the ANN may be a trained using a supervised learning algorithm such that object identifiers are associated with images of particular objects within training images provided to the ANN. Once trained, the ANN may be provided with the sensor data 932 and the item data 126 to allow for a determination of similarity between two or more images.

In some implementations, the item tracking module 928 may process image data 118 using one or more machine vision counting techniques to determine a count of the items 106. For example, machine vision counting techniques may be configured to recognize a top or front portion of the items 106 in the image data 118. This determination may be based on item data 126, such as previously acquired images of a sampled item 106. Each of the tops of the type of item 106 appearing in the image data 118 may be identified and a count made. A change in count may be determined based on image data 118 obtained at a first time and a second time, respectively.

In one implementation, the item tracking module 928 may use one or more algorithms to determine the items 106 in the FOV 120. For example, a histogram of gradients (HOG) algorithm may be used to extract the features of the items 106. A state vector machine (SVM) may then be used to classify the extracted features and determine which of the extracted features correspond to items 106. Output data 940 may be generated that is the resulting count of the items 106 determined by the SVM to be in the image data 118.

Other modules 942 may also be present in the memory 916 as well as other data 944 in the data store 920. For example, the other modules 942 may include an accounting module while the other data 944 may include billing data. The accounting module may be configured to assess charges to accounts associated with particular users 108 or other entities, while the billing data may include information such as payment account numbers. In another example, the other modules 942 may include a seed distribution module. The seed distribution module may access physical layout data 934 and distribute seed value 402 to the devices controlling the capacitive sensors 112(2) such that the seed value 402 in use by adjacent devices are different. The seed distribution module may generate seed value 402, or retrieve previously generated seed value 402.

Illustrative Processes

Figure 10:
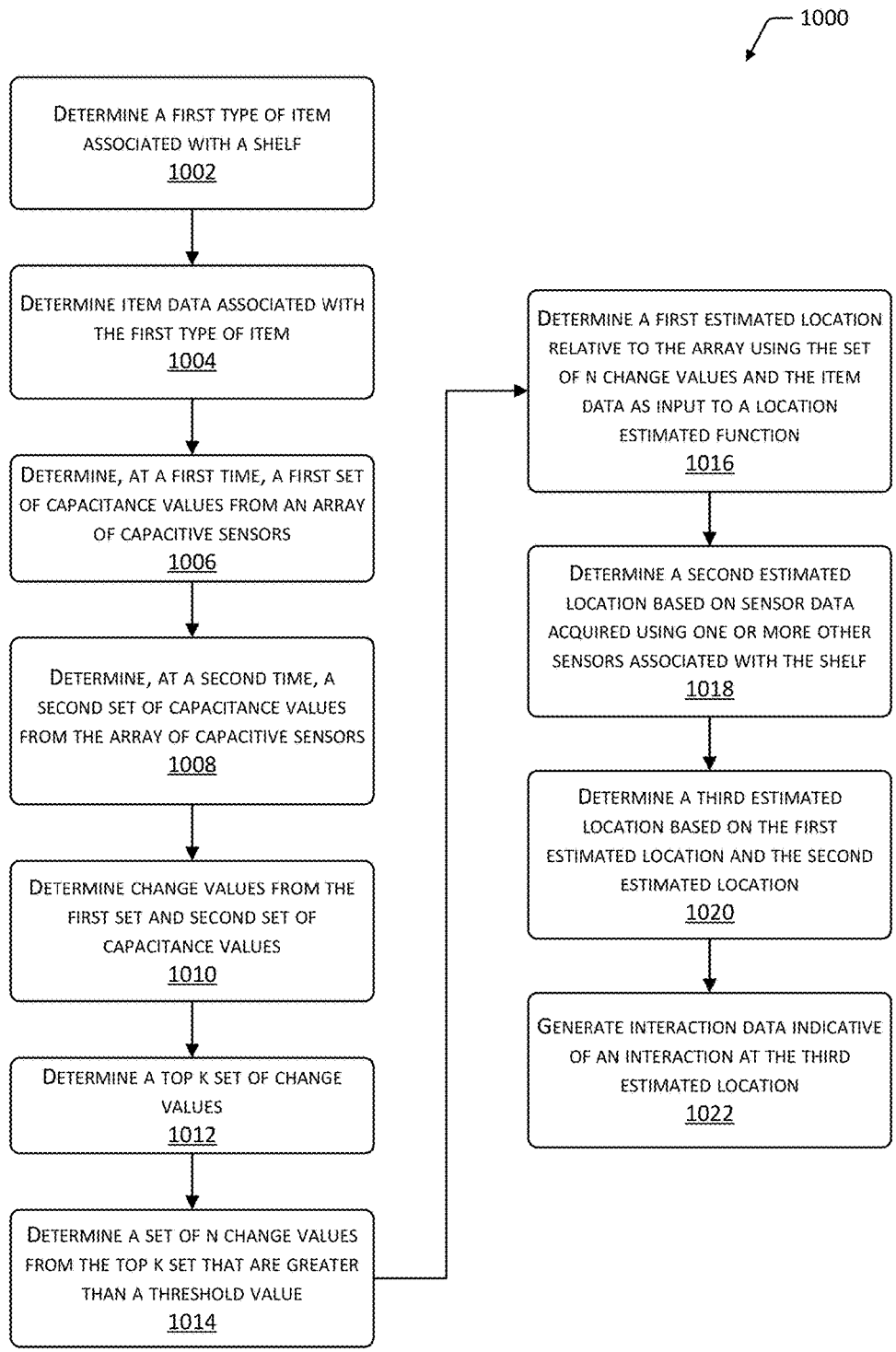
FIG. 10 depicts a flow diagram of a process for determining a location of an interaction at an inventory location, according to some implementations.

FIG. 10 depicts a flow diagram of a process 1000 for determining a location of an interaction at an inventory location 712, according to some implementations. The process 1000 may be implemented at least in part by one or more of a computing device at the inventory location 712, such as a shelf controller, by the server 804, or by another computing device.

At 1002, a first type of item 106 associated with the shelf 102 is determined. For example, the item data 126 may be accessed to determine the types of items 106 that are stowed at the particular shelf 102. In another example, an RFID interrogation signal may be sent at the shelf 102, and the resulting response may be used to determine the type of item 106.

At 1004, item data 126 associated with the first type of item 106 is determined. For example, the item data 126 may comprise geometry data such as information about the width and depth of the item 106, information about how the item 106 affects capacitance at a capacitive sensor 112(2), and so forth.

At 1006, a first set of capacitance values is determined at a first time from an array of capacitive sensors 112(2). For example, the capacitive sensors 112(2) may have conductive elements 206 arranged as described in FIG. 3. Each capacitance value may be indicative of capacitance at a particular capacitive sensor 112(2) or the conductive element 206 of that capacitive sensor 112(2). In some implementations, the first set of capacitance values may comprise baseline values for individual ones of the conductive elements 206.

At 1008, a second set of capacitance values is determined at a second time from the array of capacitive sensors 112(2). Each capacitance value of the second set may indicate capacitance at the particular capacitive sensor 112(2) used to generate the first set of capacitance values. For example, at a later time, the second set of capacitance values may be read out from the array of capacitive sensors 112(2).

At 1010, change values are determined by subtracting capacitance values in the first set from capacitance values in the second set, for each particular capacitive sensor 112(2). The change values are indicative of a change in capacitance over time.

At 1012, a top "k" set of the change values as sorted in descending order of greatest magnitude to least magnitude is determined, where k is a positive integer. For example, where k equals four, the four change values having the greatest absolute value may be selected. In some implementations, the top k set may include as few as one change value. The top k set of change values may be selected based on absolute value of difference, actual signed difference, percentage change, using a stepwise function, and so forth. In other implementations, other sorts may be used. For example, the change values may be sorted in ascending order of least magnitude to greatest magnitude, and the "top k" set may comprise the "bottom k" set of the change values.

At 1014, a set of "n" change values from the top k set that are greater than a threshold value is determined. For example, those change values in the top k set that are less than or equal to the threshold value may be omitted from the set of n change values. In some implementations, the set of n change values may comprise a single value.

In one implementation, the threshold value may be determined by applying a predetermined factor to the change value that exhibits the greatest value. For example, the change values may be sorted in descending order, greatest to smallest. The change value that is greatest may be multiplied by a predetermined factor (such as 0.20) to produce the threshold value. Continuing this example, change values that are less than 20% of the greatest value may be omitted from the set of n change values.

At 1016, a first estimated location relative to the array is determined using the set of n change values. In some implementations, the item data 126 may also be used to determine the first estimated location. The set of n change values and item data 126 such as dimensions, effects on capacitance, and so forth, may be used as input to a minimum mean square error estimation (MMSE) function, a Kalman filter or linear quadratic estimation, and so forth.

In some implementations, the change value of capacitance ($C_{delta}$) may be expressed using the following linear equation:

$$C_{delta} = a + b * \sqrt[2]{(x-x0)^2 + (y-y0)^2}$$

In Equation 1, the variables a and b are indicative of attributes of a particular type of item 106, such as the dimensions, effects on capacitance of that type of item 106, and so forth. The value of the variable x0 may be indicative of the coordinates along an x-axis of a centroid of a conductive element 206 used to obtain the capacitance data 116, and the value of the variable x is indicative of the coordinates of the item 106 or other object that is being detected. Likewise, the variables y0 and y are indicative of the coordinates along a y-axis (perpendicular to the x-axis) of a centroid of the conductive element 206 and the object, respectively.

An equation or other expression that relates distance from the conductive element 206 and an object may be determined experimentally by testing a representative inventory location 712 that is equipped with one or more capacitive sensors 112(2) and a using a known target. For example:

$$C_{delta} = a * e^{(lambda*d)} \quad \text{Equation 2}$$

In Equation 2, as described above, the variable a is indicative of one or more attributes of a particular type of item 106. Lambda may be determined experimentally while the variable d is indicative of a distance from a capacitive center of the item 106 to the capacitive center of the conductive element 206. For example, the capacitive center of a torus of homogenous material is located in the free space of the center of the torus.

In the implementation utilizing a minimum mean square error (MMSE) function with the set of n change values, several possible cases may be presented. These cases are described next.

A first case involves the situation where the only change values that exceed the threshold value are obtained from a single capacitive sensor 112(2) or the conductive element 206 associated therewith. In this situation, the estimated location is the location of that capacitive sensor 112(2) or the conductive element 206.

A second case occurs when the number of capacitive sensors 112(2) (or the associated conductive elements 206) that produce change values exceeding the threshold value is greater than or equal to two. In this situation, the first estimated location may be determined as:

$$(x,y) = \text{Min}\{\Sigma(C_{delta_i} * e^{(lambda*d_i)} - C_{delta_1} * e^{(lambda*d_1)})^2\}$$

where i=2 to n, $$d_1 = \sqrt[2]{(x-x1)^2 + (y-y1)^2}$$
$$d_i = \sqrt[2]{(x-xi)^2 + (y-yi)^2}$$

and (xi, yi) is indicative of the location of the $i^{th}$ capacitive sensor 112(2) or conductive element 206 that provided a change value greater than the threshold value.

At 1018, a second estimated location is determined based on sensor data 932 acquired using one or more other sensors 112. In one example, a second estimated location is determined based on weight data 114 acquired using the plurality of weight sensors 112(1). Each weight value may be indicative of a weight at a particular weight sensor 112(1). At a first time, a first set of weight values from the plurality of weight sensors 112(1) may be determined. At a second time, a second set of weight values from the plurality of weight sensors 112(1) may be determined. Weight change values may be generated based on the first set of weight values and the second set of weight values. A center of weight change location may be determined based on the weight change values. For example, given the relative positions and distances of the weight sensors 112(1) and the respective weight changes measured at each of the relative positions of the weight sensors 112(1), a center of weight (or center of mass) change may be determined. For example, the second estimated location may be indicative of a location on the shelf 102 associated with the change in the center of weight. A location of the center of weight may be designated as the second estimated location. In another example, a center of weight based on a first set of weight values acquired at a first time and a second set of weight values acquired at a second time may be calculated.

Weight change data is indicative of a change in weight as measured by one or more of the weight sensors 112(1) from a first time to a second time. For example, calculation of the weight change data may comprise subtracting a first weight obtained at the first time from the second weight obtained at the second time. In some implementations, the inventory management module 924 may determine the weight change data. In other implementations, the determination of the weight change data may be performed at least partially onboard the weight sensor 112(1) or an associated device such as a controller. In some implementations, the weight change data may include information indicative of noise in the weight data 114, variability of the weight data 114, estimated reliability of the weight data 114, and so forth.

Weight distribution data may provide data indicative of weight distribution at a particular time. The weight distribution data may be expressed as a measured weight at a particular weight sensor 112(1), a ratio or percentage of weight on a weight sensor 112(1), and so forth. For example, the weight distribution data may be expressed as "3213 g left, 2214 g right", "0.59 left, 0.41 right", and so forth. In some implementations, the inventory management module 924 may determine the weight distribution data. In other implementations, the determination of the weight distribution data may be performed at least partially onboard the weight sensor 112(1) or an associated device such as a controller. The weight distribution data may indicate a change in the weight distribution from a first time to a second time. The weight distribution data may be expressed as a weight associated with one or more of the weight sensors 112(1). For example, the weight distribution data for a configuration in which a rectangular shelf has a weight sensor 112(1) at each of the four corners may have weight distribution data corresponding to each of the corners. In another example, data from weight sensors 112(1) may be combined, such as to provide a weight measured at a left side of the inventory location 712 and a weight measured at a right side of the inventory location 712. In some implementations, the inventory management module 924 may determine the weight distribution data. In other implementations, the determination of the weight distribution data may be performed at least partially on board the weight sensor 112(1) or an associated device such as a controller. The weight distribution data may provide data indicative of center of weight (COW) at a particular time. For example, the weight distribution data may indicate a COW, change in the COW from a first time to a second time, and so forth.

A variety of techniques may be used to calculate the COW or center of gravity. The COW may be described as a point in space at which weighted position vectors relative to the point sum to zero. For example, the COW of a uniform sphere is a point in the center of the sphere. In another example, the COW of a toroid is a point is the center of the toroid. A variety of techniques may be used to calculate the COW. Consider a simple system having two masses, m1 and m2, arranged along a single axis "x" at positions x1 and x2, respectively. The position of each mass is given as a distance "x" relative to an origin. The COW may be expressed by the equation:

$$x = ((m1*x1) + (m2*x2))/(m1+m2) \qquad \text{Equation 4}$$

The physical characteristics of the inventory location 712, placement of the weight sensors 112(1) at the inventory location 712, physical position of the lane 104 relative to the inventory location 712, quantity and weight of the items 104 at the respective lanes 104, and so forth, may be known. For example, given the physical design of the inventory location 712, it may be known that a weight sensor 112(1) is positioned at each of the four corners of a shelf 102, and that the shelf 102 has a particular length and width. Continuing the example, based on the physical design of the inventory location 712, the physical coordinates corresponding to the lane 104 on that shelf 102 are known. Using this information, as well as the item data 126, weight characteristic data may be generated for an inventory location 712 before, during, or after an interaction.

Location of weight change (LWC) data provides information indicative of the location, with respect to the inventory location 712, at which a weight change has taken place. For example, the LWC data may indicate that a weight change has taken place at 15 cm from the origin of the inventory location 712. The LWC data may be determined using the weight data 114. For example, the LWC data may be calculated from the weight distribution data.

In some implementations, the LWC data may be expressed as a vector value having a direction and a magnitude. For example, the LWC data may comprise a vector having a first endpoint at an origin of the inventory location 712 and a second endpoint at the LWC.

In one implementation, the LWC data may be determined as follows. Assume a situation wherein the inventory location 712 comprises a shelf 102 having a width "a", a left weight sensor 112(1) located at a distance "b" from the left edge of the shelf 102 and right weight sensor 112(1) located at a distance "b" from the right edge of the shelf 102. The weight measured by the left weight sensor 112(1) is "w1" and the weight measured by the right weight sensor 112(1) is "w2". A distance "LWC" indicative of the location of weight change from an origin at the leftmost edge of the shelf 102 may be calculated to the center-of-mass of an individual item 106 that has been added or removed in an interaction using the following equation:

$$LWC = w2*(a-2b)/(w2+w1) + b \qquad \text{Equation 5}$$

The weight change corresponding to the interaction may be calculated as:

$$\text{Total weight change} = w1 + w2 \qquad \text{Equation 6}$$

During operation, the weight data 114 may be "tared" or zeroed out while the load on the platform measured by the weight sensors 112(1) is in a stable state. Subsequent changes in the weight data 114 may be used to produce the weight distribution data. For example, the inventory location 712 when fully loaded may have a total weight of 15 kg. The processing module may "tare" these values, such that the weight is read to be "0 kg". A subsequent interaction such as a removal of two items 106 may result in a total weight change of 910 grams, with a weight distribution of 850 g on the left and 55 g on the right. Given a shelf width "a" of 1 m and the distance "b" of 0.1 m, the LWC is at 0.148 meters from the origin at the leftmost edge of the shelf 102.

In another implementation, a second estimated location is determined based on image data 118 acquired using the image sensor 112(3) having a FOV 120 that includes at least a portion of the shelf 102. For example, a change between images in the image data 118 acquired at a first time and a second time may be used to determine a location of an object such as a hand of the user 108. The second estimated location may be determined by mapping coordinates in the image associated with the portion of the hand with a particular location on the shelf 102. Continuing the example, a box bounded by image coordinates (row, column) of (120, 73) and (200, 140) may correspond to a physical location coordinates (x, y) of (3 inches, 4 inches).

At 1020, a third estimated location is determined based on the first estimated location and the second estimated location. For example, the third estimated location may comprise a location that is midway between the first estimated location and the second estimated location. In some implementations, a weighted average location may be calculated. Weights used in this determination may be indicative of the relative degree of precision and accuracy associated with the particular sensors 112 or location methodology that is used.

At 1022, interaction data 128 is generated that is indicative of an interaction at the third estimated location. For example, a particular type of item 106 may be determined based on the third estimated location. A change in weight indicated by the weight data 114 or a change in the count of items 106 determined using image data 118 may be used to determine the change in quantity associated with the particular type of item 106. The interaction data 128 may then indicate that the particular type of item 106 experienced a particular change in quantity at the specified inventory location 712.

Figure 11:
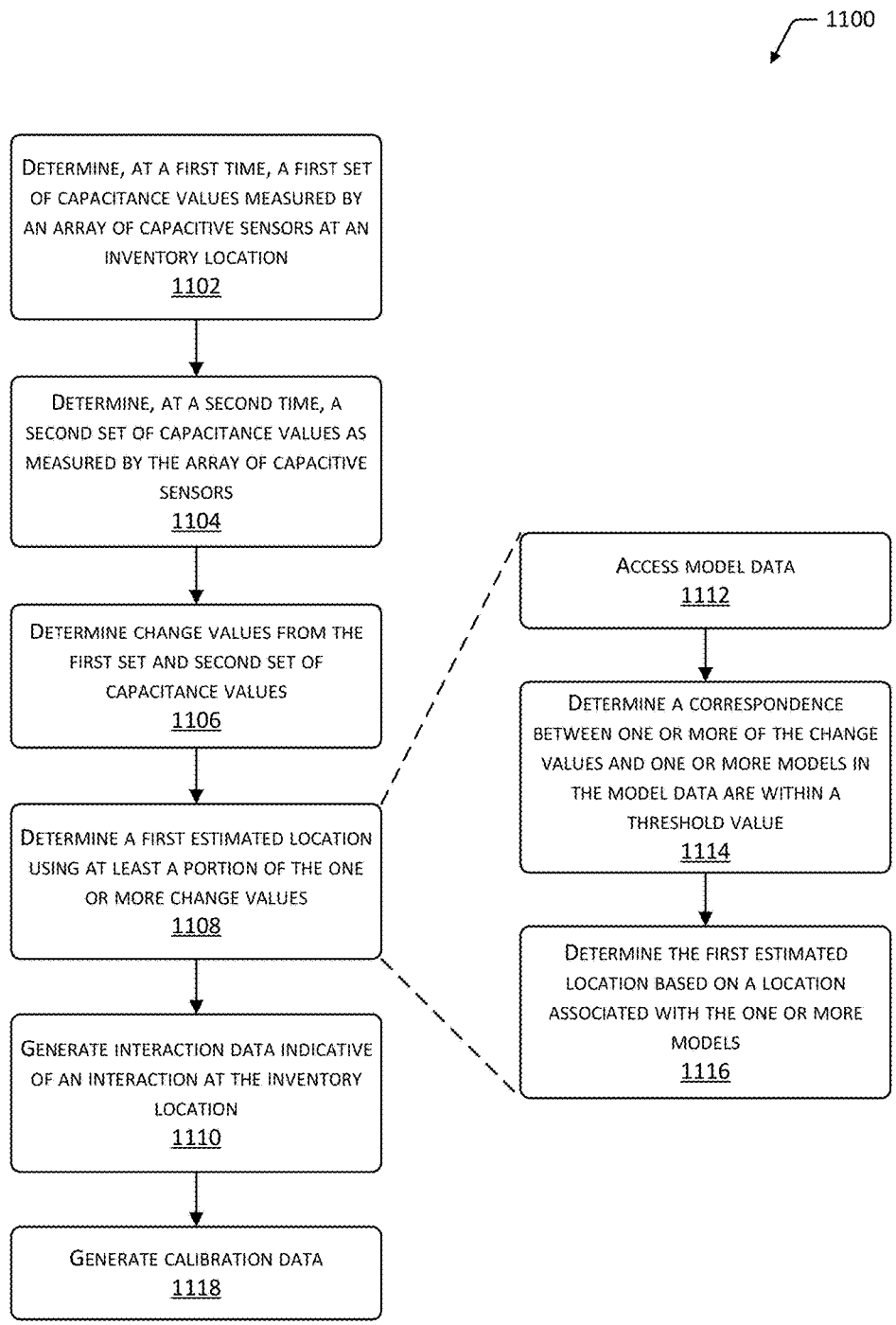
FIG. 11 depicts a flow diagram of another process for determining a location of an interaction at an inventory location, according to some implementations.

FIG. 11 depicts a flow diagram of another process 1100 for determining a location of an interaction at an inventory location 712, according to some implementations. The process 1100 may be implemented at least in part by one or more of a computing device at the inventory location 712, such as a shelf controller, by the server 804, or by another computing device.

At 1102, a first set of capacitance values measured by the array of capacitive sensors 112(2) is determined at a first time. Each capacitance value indicates a capacitance value as measured by a particular capacitive sensor 112(2) at the first time. In some implementations, the first set of capacitance values may be contemporaneous but not obtained at exactly the same time. For example, as the conductive elements 206 are scanned in accord with the sequence data 408, the individual capacitance values may be obtained sequentially within a particular interval of time. The first set of capacitance values may comprise baseline values for individual ones of the conductive elements 206. In some implementations, each of the baseline values for a particular conductive element 206 may be determined from one or more measurements made using that particular conductive element 206.

At 1104, a second set of capacitance values measured by the array of capacitive sensors 112(2) is determined at a second time. Each of the capacitance values indicates a capacitance value as measured by the particular capacitive sensor 112(2). For example, the same capacitive sensor 112(2) that produces a capacitance value that is in the first set of capacitance values may then be used to produce a capacitance value that is in the second set of capacitance values. In some implementations, each of the second set of values for a particular conductive element 206 may be determined from one or more measurements made using that particular conductive element 206.

At 1106, one or more change values based on the capacitance values in the first set and the capacitance values in the second set are determined. For example, individual capacitance values in the first set may be subtracted from the individual capacitance values in the second set that are associated with the same conductive element 206.

At 1108, a first estimated location is determined using at least a portion of the one or more change values. For example, the change values may be processed using a MMSE function as described above, a linear quadratic estimation, and so forth. As described above, in some implementations, the first estimated location may be determined using item data 126. For example, the item data 126 may be indicative of a width and depth of the type of item 106 and a composition of the type of item 106. The estimated location based on the change values may be constrained based on the width and depth of the type of item 106. For example, a type of item 106 that exhibits an area that is less than the size of a conductive element 206 would not be expected to have an estimated location that spans three or more conductive elements 206. In another implementation, the width and depth of the type of the item 106 and composition may be used to determine an expected capacitance due to the presence of the item 106 at a location. This expected capacitance may then be used to determine an area on the shelf 102 that the first estimated location encompasses, with that area corresponding to the area described by the width and depth of the type of item 106.

At 1110, interaction data 128 is generated indicative of an interaction at the inventory location 712 or portion thereof associated with the first estimated location. For example, based on the estimated location, a particular type of item 106 may be identified. Based on sensor data 932 such as weight data 114, capacitance data 116, image data 118, and so forth, a quantity of the items 106 at the inventory location 712 may be determined.

In some implementations, the first estimated location data may be adjusted or snapped to a particular predefined location. For example, data indicative of one or more predetermined lanes 104 at the inventory location 712 may be accessed in the physical layout data 934. A particular lane 104 may be determined that is one or more of: closest to the first estimated location or encompasses the first estimated location. For example, the first estimated location may be within the boundaries of the particular lane 104. The interaction data 128 may then be associated with the particular lane 104.

In some implementations, additional sensor data may be used to determine a second estimated location. The second estimated location may be used along with the first estimated location to determine a third estimated location.

Returning to 1108, many different techniques may be used to determine the first estimated location using at least a portion of the one or more change values. In one implementation depicted here, at 1112, model data comprising one or more models is accessed. Model data may comprise different models, each model representative of a particular configuration of capacitance change values and the location that each is associated with. In some implementations, the model data may be generated in advance such as during set up for configuration of the inventory location 712.

In another implementation, the determination of the first estimated location may use item data 126. One or more types of items 106 associated with the inventory location 712 may be determined. For example, the types of items 106 designated as being stowed a particular inventory location 712 may be retrieved. The item data 126 associated with these one or more types of items 106 may then be accessed. The determination of the first estimated location may then use the item data 126 associated with these one or more types of items 106. Continuing the example, the geometry data indicative of a width and depth of a particular type of item 106, information about the effect of that type of item 106 on capacitance, and so forth, may be used by the location estimation module 618 to generate location data 620.

In some implementations, information about items 106 that are proximate to the inventory location 712 may be used to generate location data 620. For example, the account item data 936 that is indicative of the one or more types of items 106 that are within the custody of a particular user 108 or other agent such a robot may be accessed. The items 106 that are in custody of the user 108 may be stowed in the tote 110, carried, and so forth. When the user 108, other agent, the tote 110, and so forth, are within a threshold distance of the inventory location 712, they may be deemed to be proximate. The item data 126 associated with these types of items 106 that are proximate to the inventory location 712 may be accessed. The item data 126 for those types of items 106 that are proximate may then be used to determine the first estimated location. For example, different model data associated with different types of items 106 that are present within the account item data 936 may be assessed with regard to the actual capacitance data 116.

At 1114, at least a portion of the change values are determined to fit one of the one or more models within a threshold value. For example, a curve fitting technique may be used to fit the change values to the different models, and the model that exhibits a least variance between the change values and model values may be determined to be a best fit. In another example, a correspondence between the one or more capacitance change values and one of the one or more models may be determined to be within a threshold value. For example, the threshold value may specify 10%, a first model may indicate a capacitance change value of 15 pF. Continuing the example, a second model may indicate a capacitance change value of 27 pF, and the capacitance change value measured by the capacitive sensor 112(2) may be 16 pF. Based on this, a correspondence may be determined between the first model and the capacitance change value.

At 1116, the first estimated location is determined based on a location associated with the one or more models. Continuing the example above, a location associated with the model that exhibits the least variance between the change values and the model values may be deemed to be the estimated location.

A calibration operation may be incorporated into the process. At 1118, calibration data 622 may be generated by using the first estimated location obtained, as described above, using the capacitance values and the second estimated location obtained using other sensor data. The calibration data 622 may be indicative of a differential between the first estimated location and the second estimated location. For example, a second estimated location may be determined based on image data 118 acquired using the image sensor 112(3). Calibration data 622 indicative of a difference between the first estimated location and the second estimated location may then be determined. In other implementations, the calibration data 622 may be indicative of a differential between the first estimated location and information indicative of a specified location. For example, the human operator may manually enter information indicative of a location, a predefined test target at a known location may be used, and so forth.

Figure 12:
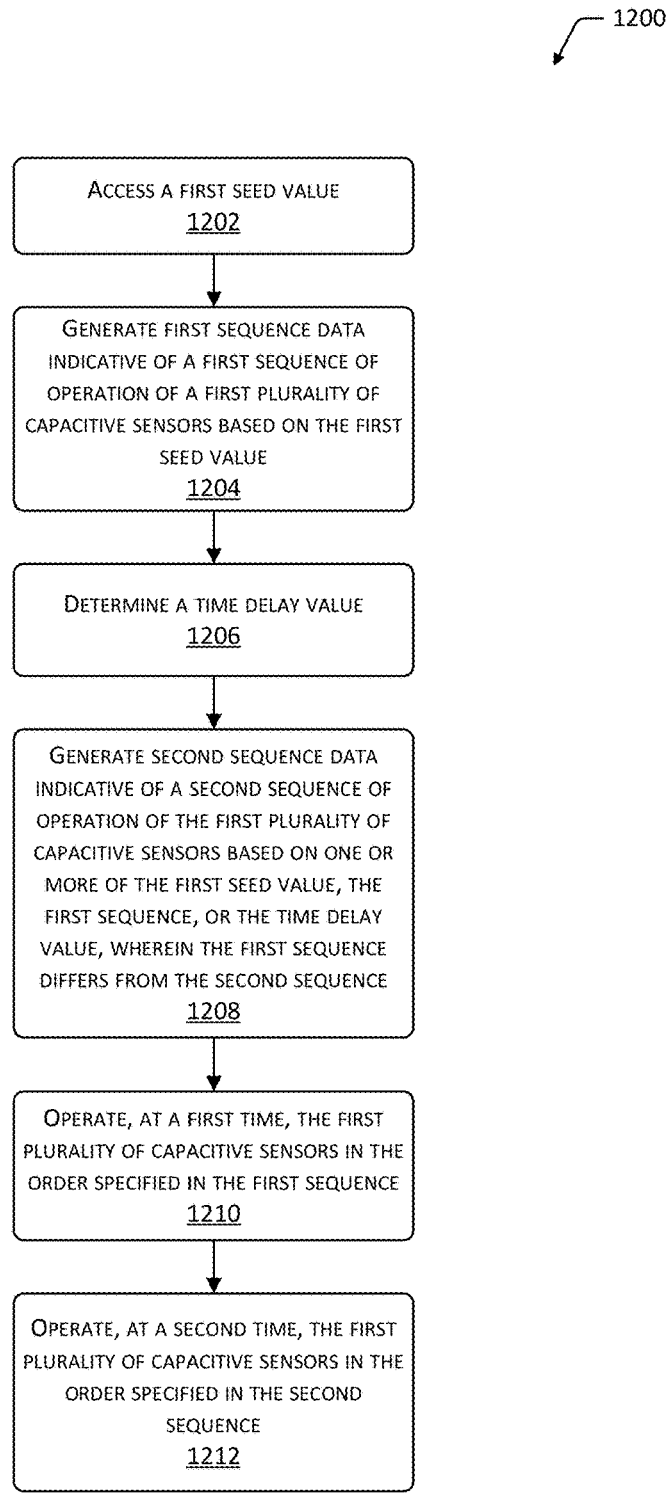
FIG. 12 depicts a flow diagram of a process for generating and operating conductive elements in a capacitive sensor, according to some implementations.

FIG. 12 depicts a flow diagram of a process 1200 for generating and operating conductive elements 206 in a capacitive sensor 112(2), according to some implementations. The process 1200 may be implemented at least in part by one or more of a computing device at the inventory location 712, such as a shelf controller, by the server 804, or by another computing device.

At 1202, a first seed value 402(1) is accessed. In one implementation, the seed value 402 may be received from an external device such as a server 804. The seed value 402 may be associated with a particular device based on the physical location within the facility 702. For example, the physical layout data 934 may comprise information indicating that first shelf 102(1) is adjacent to second shelf 102(2), second shelf 102(2) is adjacent to third shelf 102(3), and so forth. Using this information, the seed value 402 may be allocated to the devices in various inventory locations 712 to avoid two capacitive sensors 112(2) that are adjacent to one another from using the same seed value 402. In some implementations, the physical layout data 934 may be schematic or logical in nature, indicating the relative placement that corresponds to physical placement but without specific coordinate data, dimensional information, and so forth.

At 1204, first sequence data 408(1) comprising data elements indicative of individual ones of the first plurality of capacitive sensors 112(2) is generated based on the first seed value 402(1). For example, the sequencer module 404 may utilize as input the first seed value 402(1) and generate first sequence data 408(1).

At 1206, a time delay value 406 is determined. For example, the time delay value 406 may be determined based on output from a pseudorandom number generator.

At 1208, second sequence data 408(2) comprising data elements indicative of individual ones of the first plurality of capacitive sensors 112(2) is generated. In one implementation, the second sequence data 408(2) may be based on the first seed value 402(1). In another implementation, the second sequence data 408(2) may be based on a second seed value 402(2), or may be based on the first sequence data 408(1). The first sequence data 408(1) differs from the second sequence data 408(2).

In one implementation, the generation of sequence data 408 may use a pseudorandom function with the seed value 402 as an input. In another implementation, the generation of the sequence data 408 may utilize hash function with the seed value 402 as an input. For example, the hash function may generate a hash output. The hash output may then be associated with particular ones of the conductive elements 206. In some implementations, the generation of sequence data 408 may use other inputs in addition to the seed value 402. For example, the time data provided by an onboard clock, output from a random number generator, a media access control address, and so forth, may be used in conjunction with the seed value 402 to generate sequence data 408.

The sequence data 408 may include a command or instruction indicative of a pause that is based on the time delay value 406. For example, data indicative of a 5 ms pause may be randomly inserted into the first sequence data 408(1) by the sequencer module 404.

At 1210, the first plurality of capacitive sensors 112(2) are operated at a first time in the order specified in the first sequence data 408(1). When an instruction or command indicative of the pause is processed, operation of the capacitive sensor module 212 may be temporarily altered for the duration of the interval of time specified by the delay. For example, the switch module 210 may temporarily increase the amount of time spent on a particular conductive element 206. In another example, the capacitive sensor module 212 may suspend the generation of the capacitive signal 208 for the interval of time.

At 1212, the first plurality of capacitive sensors 112(2) are operated at a second time in the order specified in the second sequence data 408(2).

As described above, the seed values 402 and the resulting sequence data 408 may differ between adjacent devices. For example, first shelf 102(1) with electronics including a capacitive sensor module 212 may use a first seed value 402(1) while a second shelf 102(2) may use a second seed value 402(2) that is different from the first seed value 402(1). By operating these adjacent capacitive sensors 112(2) using different sequence data 408, interference between the two or more capacitive sensors 112(2) may be reduced or eliminated.

In some implementations, a particular set of sequence data 408 may be used more than once. For example, the first sequence data 408(1) and the second sequence data 408(2) may be alternately used.

Figure 13:
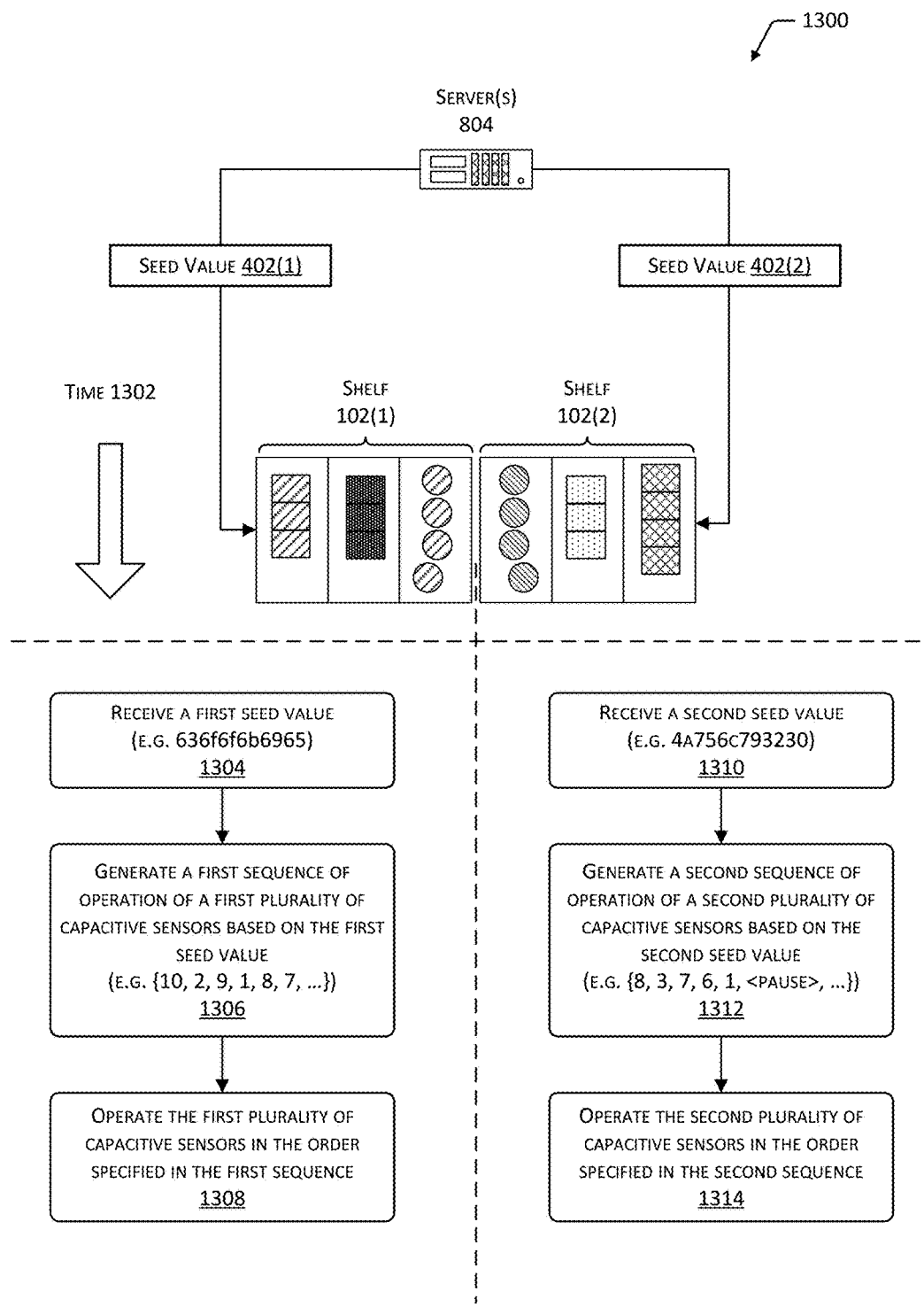
FIG. 13 depicts a flow diagram of a process for using different seed values in adjacent inventory locations to operate conductive elements in a capacitive sensor, according to some implementations.

FIG. 13 depicts a flow diagram of a process 1300 for using different seed values 402 in adjacent inventory locations 712 to operate conductive elements 206 in a capacitive sensor 112(2), according to some implementations. The process 1300 may be implemented at least in part by one or more of a computing device at the inventory location 712, such as a shelf controller, by the server 804, or by another computing device.

As depicted here, in some implementations, an external device such as a server 804 may provide the seed values 402 to electronics operating the capacitive sensors 112(2) for different shelves 102. A first shelf 102(1) receives a first seed value 402(1) from the server 804. A second shelf 102(2) receives a second seed value 402(2) from the server 804. As described above, the server 804 may be configured to distribute seed values 402 to avoid a situation where two adjacent devices are using the same seed value 402.

In this illustration, time is shown as increasing down the page, indicated by the arrow 1302. At 1304, a first computing device operating the capacitive sensors 112(2) of the first shelf 102(1) receives the first seed value 402(1). At 1306, the first computing device generates a first set of sequence data 408(1) based on the first seed value 402(1). At 1308, the first computing device operates the capacitive sensors 112(2), or the conductive elements 206 thereof, in the order specified in the first sequence data 408(1).

At 1310, the second computing device operating the capacitive sensors 112(2) of the second shelf 102(2) receives the second seed value 402(2). As illustrated here, the operations of 1310 through 1314 may occur contemporaneously with those described with regard to 1304 through 1308.

At 1312, the second computing device generates a second set of sequence data 408(2) based on the second seed value 402(2). At 1314, the second computing device operates the capacitive sensors 112(2), or the conductive elements 206 thereof, in the order specified in the second sequence data 408(2).

As a result of this technique, interference between capacitive sensors 112(2) of the first shelf 102(1) and the second shelf 102(2) may be minimized.

Figure 14:
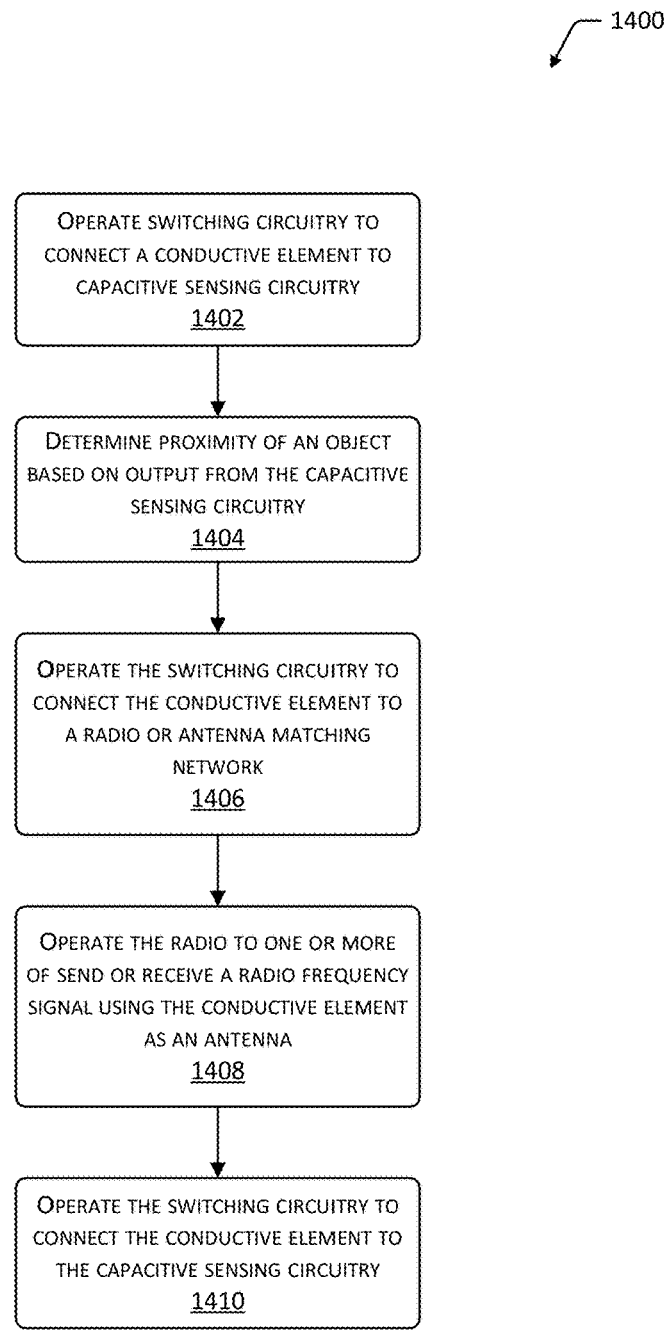
FIG. 14 depicts a flow diagram of a process for using a conductive element as part of a capacitive sensor and as a radio frequency antenna, according to some implementations.

FIG. 14 depicts a flow diagram of a process 1400 for using a conductive element 206 as part of a capacitive sensor 112(2) and as a radio frequency antenna, according to some implementations. The process 1400 may be implemented at least in part by one or more of a computing device at the inventory location 712, such as a shelf controller, by the server 804, or by another computing device.

At 1402, a switch module 210 comprising switching circuitry operates to selectively connect particular ones of the one or more conductive elements 206 to the circuitry of the capacitive sensor module 212 or to a radio module 508. In some implementations, the switch module 210 may connect to an antenna matching network module 512 instead of the radio module 508.

At 1404, an object is determined to be proximate to a conductive element 206 of a capacitive sensor 112(2) based on output from the capacitive sensor module 212. For example, a change in capacitance values from a first time to a second time that exceeds a threshold value may be indicative of proximity.

At 1406, the switching circuitry is operated to connect the one or more particular conductive elements 206 to the radio module 508 or the antenna matching network module 512. For example, a network of FETs or other transistors may be used to disconnect the particular conductive element 206 from the capacitive sensor module 212 and connect that particular conductive element 206 to a radio module 508.

At 1408, the radio module 508 may be operated to one or more of send or receive a radio frequency signal using the one or more particular conductive elements 206 connected via the switch module 210. The one or more particular conductive elements 206 are now acting as one or more antennas. For example, the radio frequency signal 510, such as an RFID interrogation signal, may be generated by the radio module 508 and emitted by the conductive elements 206.

At 1410, switching circuitry of the switch module 210 may be operated to disconnect the radio module 508 or the antenna matching network module 512 from the particular conductive element 206, and instead connect the conductive element 206 to the capacitive sensor module 212.

In some implementations, operation of the switch module 210 to connect the radio module 508 or the antenna matching network module 512 to particular conductive element 206 may be responsive to other event data 506 or other data. For example, the change in weight values obtained by the weight sensors 112(1) that exceeds a threshold value may result in the switch module 210 coupling the radio module 508 to a particular conductive element 206.

By using this technique, the conductive element 206 may be used for more than one purpose. Additionally, this technique when used in conjunction with arrays of the conductive elements 206 such as described above with regard to FIGS. 2 and 3 allows for the transmission and reception of radio frequency signals 510 at particular physical locations. This control may be used to determine the location of a radio frequency source, such as determining the location of an RFID tag.

Figure 15:
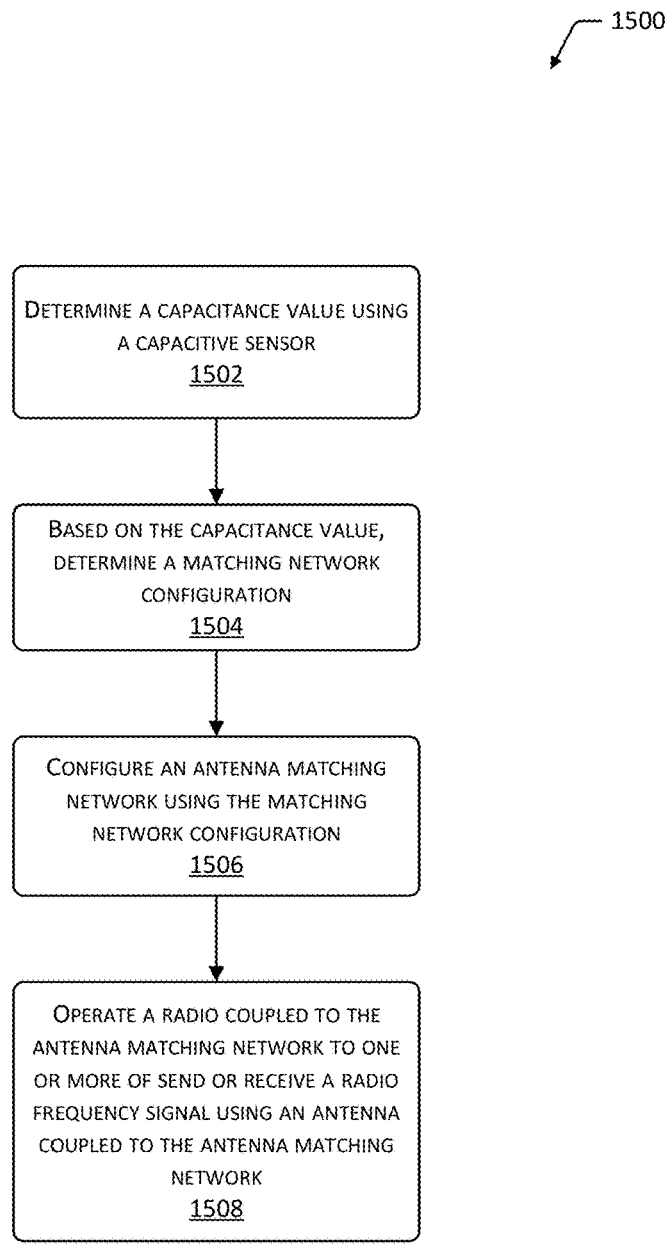
FIG. 15 depicts a flow diagram of a process for using capacitance data to select a particular configuration of an antenna matching network, according to some implementations.

FIG. 15 depicts a flow diagram of a process 1500 for using capacitance data 116 to select a particular configuration of an antenna matching network, according to some implementations. The process 1500 may be implemented at least in part by one or more of a computing device at the inventory location 712, such as a shelf controller, by the server 804, or by another computing device. As described above, the impedance of an antenna may change based on the presence of nearby objects. Situations in which the impedance of the antenna varies beyond a threshold amount from the impedance associated with the radio module 508 may result in poor performance of the radio module 508 due to a poor transfer of power between the radio module 508 and the antenna. Additionally, an impedance mismatch may result in the reflection of power emitted by the radio module 508 that may result in damage to the circuitry of the radio module 508, feedline, and so forth. By configuring an antenna matching network module 512 to address a potential impedance mismatch prior to use, performance of the radio module 508 during operation may be improved and the likelihood of damage to the radio module 508 may be reduced.

At 1502, a capacitance value is determined using at least a portion of a first plurality of capacitive sensors 112(2). For example, the capacitance data 116 may indicate a particular capacitance value reported by the capacitive sensor module 212.

At 1504, based on the capacitance value, a matching network configuration 514 may be determined. For example, a lookup table or other data structure may be used to associate particular capacitance values with a particular matching network configuration 514.

At 1506, the antenna matching network module 512 is configured to use the determined matching network configuration 514. For example, the antenna matching network module 512 may comprise circuitry that allows for reconfigurable circuit networks of particular inductors or capacitors. In another example, the antenna matching network module 512 may comprise discrete sections of circuitry, each providing a particular impedance transform. Continuing this example, the antenna matching network module 512 may include switching circuitry that allows for the use of a designated matching network configuration 514 to transfer the radio frequency signal 510.

At 1508, the radio module 508 coupled to the antenna matching network module 512 is operated to one or more of send or receive a radio frequency signal 510 using an antenna coupled to the antenna matching network module 512.

Figure 16:
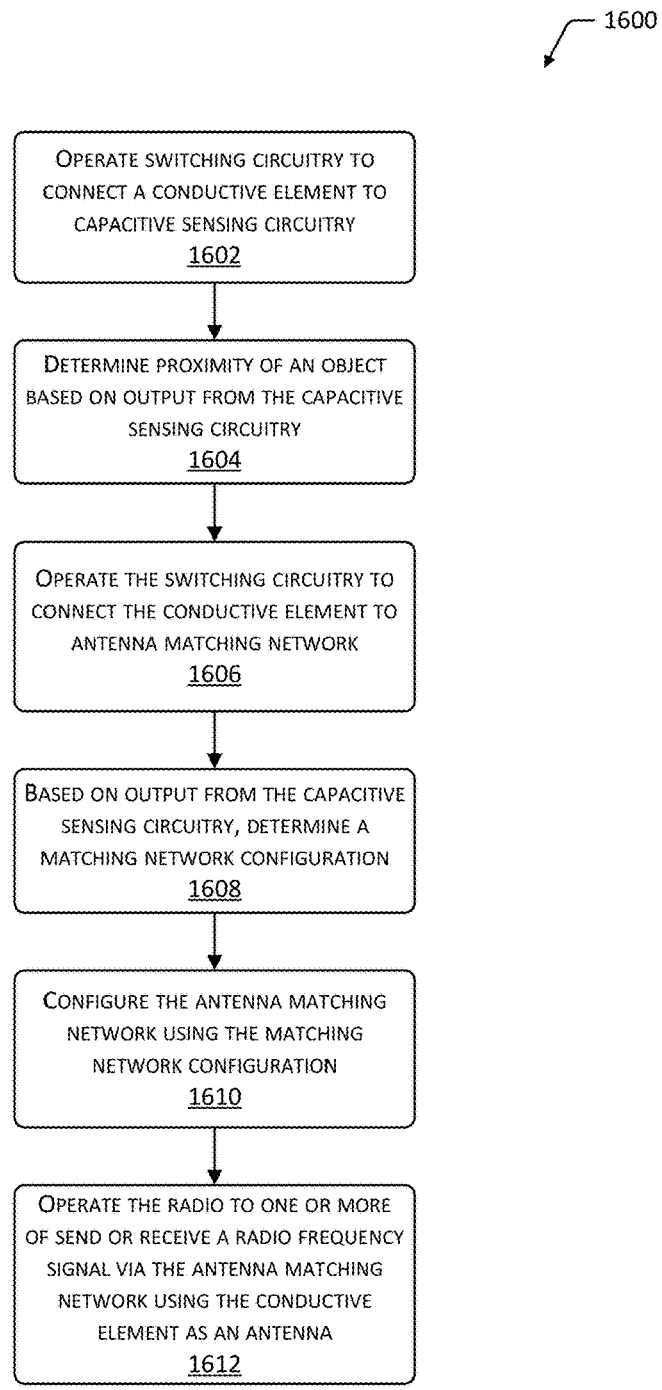
FIG. 16 depicts a flow diagram of a process for using a conductive element as part of a capacitive sensor and a radio frequency antenna, with the tuning of that antenna being based on capacitance data, according to some implementations.

FIG. 16 depicts a flow diagram of a process 1600 for using a conductive element 206 as part of a capacitive sensor 112(2) and a radio frequency antenna, with the tuning of that antenna being based on capacitance data 116, according to some implementations. The process 1600 may be implemented at least in part by one or more of a computing device at the inventory location 712, such as a shelf controller, by the server 804, or by another computing device.

At 1602, switching circuitry such as the switch module 210 is operated to connect the particular ones of the one or more conductive elements 206 to the capacitive sensing circuitry of the capacitive sensor module 212.

At 1604, proximity of an object is determined based on output from the capacitive sensor module 212.

At 1606, the switch module 210 is operated to connect the one or more particular conductive elements 206 to the antenna matching network module 512.

At 1608, based on output from the capacitive sensor module 212, a matching network configuration 514 is determined. For example, based on the capacitance data 116 generated by the capacitive sensor module 212, a lookup table may be used to retrieve the particular matching network configuration 514 for use. In another example, the output from the capacitive sensing circuitry may comprise proximity data 502. Responsive to this proximity data 502, a particular matching network configuration 514 may be determined.

At 1610, the antenna matching network module 512 is configured to use the matching network configuration 514.

At 1612, the radio module 508 is operated to one or more of send or receive a radio frequency signal 510 using the one or more particular conductive elements 206 as an antenna.

In other implementations, the order of this and the other flow diagrams in this disclosure may be changed. For example, the operations indicated at 1608 and 1610 may occur prior to the operation of 1606.

Figure 17:
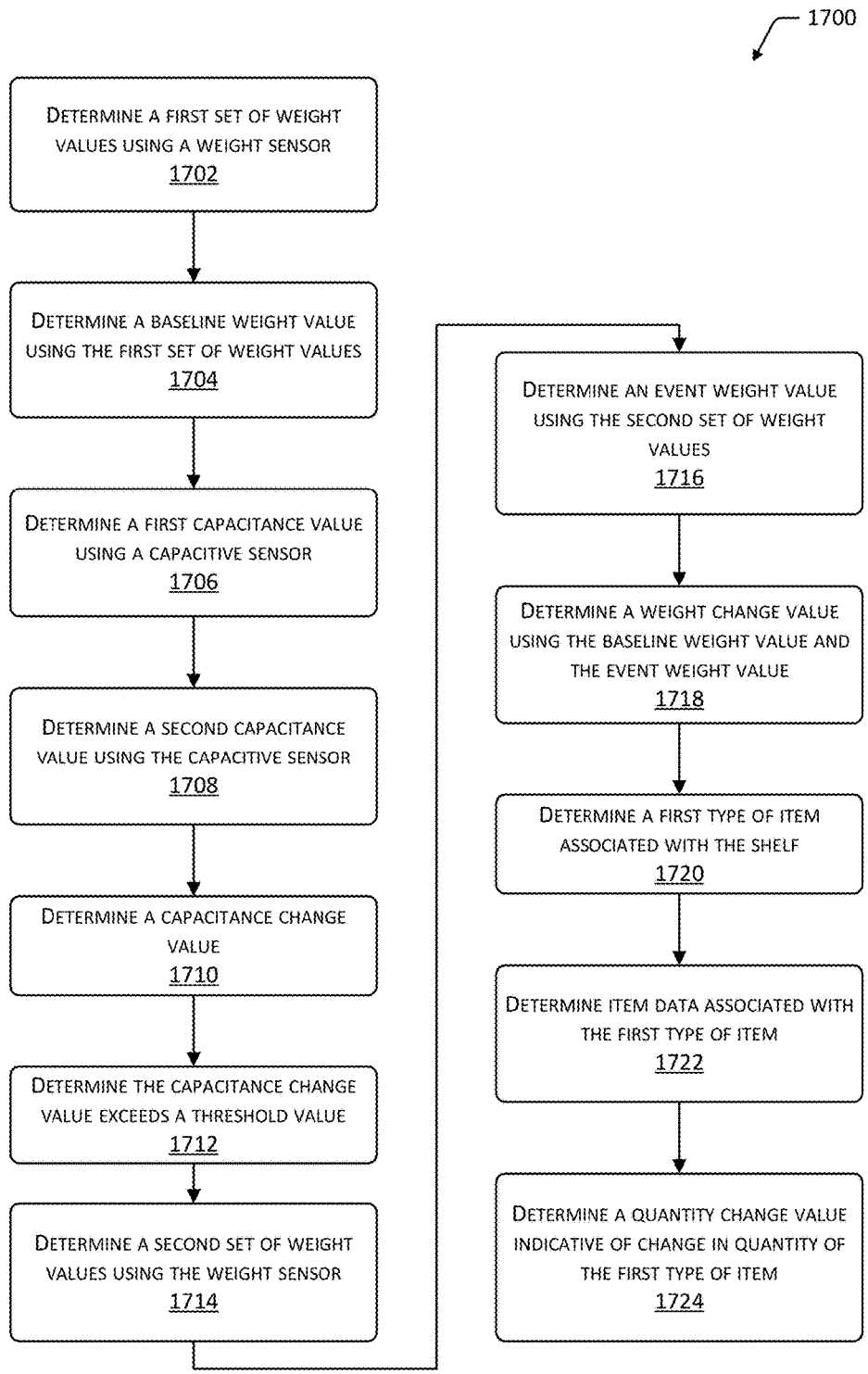
FIG. 17 depicts a flow diagram of a process for using capacitance data to determine the change in quantity of an item stowed at an inventory location, according to some implementations.

FIG. 17 depicts a flow diagram of a process 1700 for using capacitance data 116 to determine the weight data 114 from a weight sensor 112(1) at an inventory location 712, according to some implementations. The process 1700 may be implemented at least in part by one or more of a computing device at the inventory location 712, such as a shelf controller, by the server 804, or by another computing device.

At 1702, a first set of weight values is determined using one or more of the weight sensor 112(1). In some implementations, a single weight value may be determined.

At 1704, a baseline weight value is determined using the first set of weight values. For example, the baseline weight value may be indicative of a weight before the occurrence of an event. The baseline weight value may comprise a sum of weight values from several weight sensors 112(1), an average of weight values from several weight sensors 112(1), and so forth.

At 1706, a first capacitance value is determined using a capacitive sensor 112(2). The first capacitance value may comprise a baseline value. In some implementations, the baseline value may be determined from one or more measurements made using a particular conductive element 206 of the capacitive sensor 112(2).

At 1708, a second capacitance value is determined using the capacitive sensor 112(2). The second capacitance value may be determined from one or more measurements made using a particular conductive element 206 of the capacitive sensor 112(2). For example, the second capacitance value may comprise an average of a plurality of individual capacitance values.

At 1710, a capacitance change value is determined. For example, the second capacitance value may be subtracted from the first capacitance value.

At 1712, the capacitance change value is determined to exceed a threshold value.

At 1714, a second set of weight values is determined using the one or more weight sensors 112(1). The determination of the second set of weight values may be responsive to the determination of 1712. In some implementations, a single weight value may be determined.

At 1716, an event weight value is determined using the second set of weight values. For example, the event weight value may be indicative of a weight measured after the occurrence of the event.

At 1718, a weight change value is determined. For example, the weight change value may be determined by subtracting the baseline weight value from the event weight value.

At 1720, a first type of item 106 is determined that is associated with the shelf 102 or other inventory location 712.

At 1722, item data 126 associated with the first type of item 106 is determined. As described above, the item data

126 may include one or more of weight per item 106 or capacitance associated with item 106.

At 1724, a quantity change value is determined. The quantity change value is indicative of a change in quantity of the first type of item 106 on the shelf 102 or inventory location 712. For example, the quantity change value may be determined by dividing the weight change value by the weight per item 106, dividing the capacitance change value by the capacitance associated with the item 106, and so forth.

In some implementations, the capacitance data 116 may be used to differentiate between different types of items 106. For example, the capacitance value associated with a box of dried pasta may be different from the capacitance value associated with a bottle filled with water.

The system may determine first item data 126(1) indicative of a change in capacitance associated with a first type of item 106. Continuing the previous example, data obtained during intake processing of the dried pasta may indicate that an individual package of this type of item 106 changes the capacitance at a capacitive sensor 112(2) by 82 microfarads. The system may then determine second item data 126(2) indicative of a change in capacitance associated with a second type of item 106. For example, data obtained during intake processing of bottled water may indicate that the bottle of water changes the capacitance of the capacitive sensor 112(2) by 347 microfarads. The system may generate first comparison data indicative of a first correspondence or comparison between the capacitance change value and the first item data 126(1). For example, the capacitance change value may be 394 microfarads, and deemed to be within a threshold value of the first item data 126(1). The system may then generate second comparison data indicative of a second correspondence or comparison between the capacitance change value and the second item data 126(2). For example, the capacitance change value of 394 microfarads may be deemed to be beyond the threshold value of the second item data 126(2). Based at least in part on these comparisons, the system may differentiate between a first type of item 106, such as the dried pasta, that is associated with the shelf 102 and a second type of item 106, such as the bottle of water, that is also associated with the same shelf 102.

Figure 18:
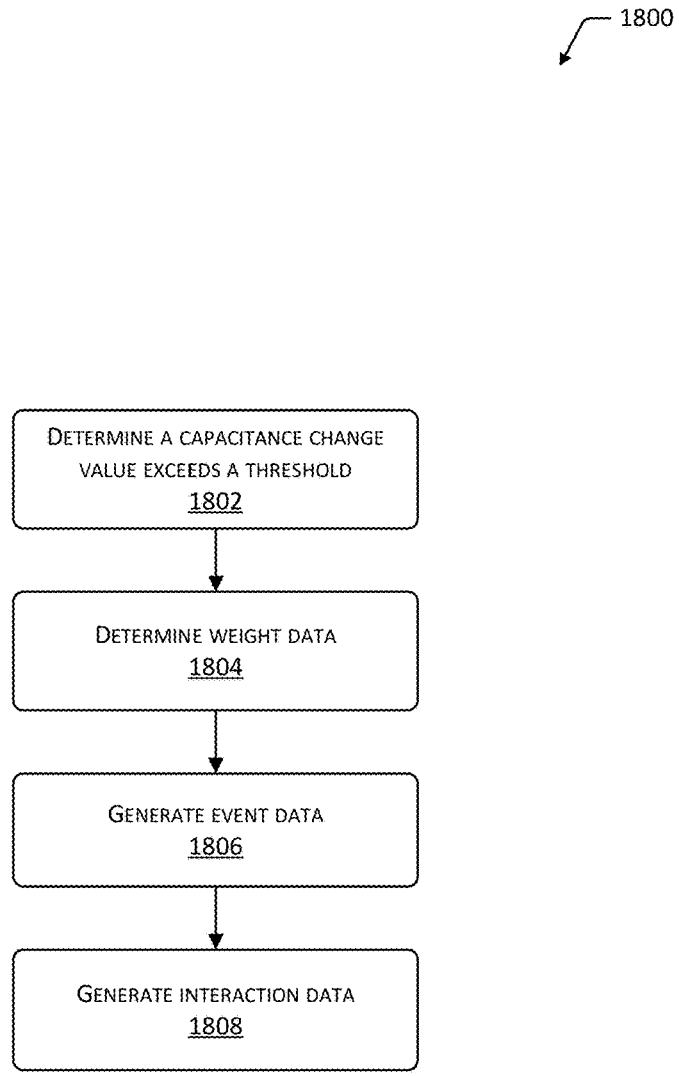
FIG. 18 depicts a flow diagram of a process for using capacitance data to generate event data about an inventory location, according to some implementations.

FIG. 18 depicts a flow diagram of a process 1800 for using capacitance data 116 to generate event data 506 about an inventory location 712, according to some implementations. For example, a change in the capacitance data 116 indicative of proximity of an object may be used to determine a particular portion of the weight data 114. The process 1800 may be implemented at least in part by one or more of a computing device at the inventory location 712, such as a shelf controller, by the server 804, or by another computing device.

At 1802, a capacitance change value measured by a capacitive sensor 112(2) at an inventory location 712 is determined. The capacitance change value may be determined to exceed a threshold value. For example, a baseline capacitance value may be determined. The baseline capacitance value may be calculated from a plurality of capacitance values obtained when the sensor data from other sensors 112(S) is indicative of no other event or activity. The baseline capacitance value may be indicative of a moving average, minimum, maximum, and so forth. A threshold capacitance value may be determined that is based on the baseline capacitance value. For example, the threshold capacitance value may be set at 80% of the moving average.

At 1804, weight data 114 is determined using one or more the weight sensors 112(1). A weight change value measured by a weight sensor 112(1) at the inventory location 712 may then be determined.

At 1806, event data 506 indicative of occurrence of an event at the inventory location 712 is generated. For example, the event data 506 may be indicative of presence of the user 108 at the inventory location 712 or addition, removal, or movement of an item 106 at the inventory location 712. The event data 506 may be generated responsive to a variety of different conditions or combinations thereof. In a first implementation, the event data 506 may be indicative of the capacitance change value exceeding a first threshold value and a weight change value exceeding a second threshold value. In a second implementation, the event data 506 may be indicative of the capacitance change value exceeding a first threshold value and the weight change value being less than a second threshold value. For example, the capacitance change value may exceed the threshold capacitance value. In a third implementation, the event data 506 may be indicative of the capacitance change value being less than a first threshold value and the weight change value exceeding a second threshold value.

In some implementations, the filter function may be determined based on the event data 506. For example, event data 506 indicative of a change in the capacitance value that exceeds a threshold value may result in the data processing module 604 utilizing a particular filter function to process the sensor data associated with the event. Continuing the example, a set of weight values corresponding to a time interval associated with the event data 506 obtained by the weight sensor 112(1) may be filtered using a specified filter function to generate processed weight data 608.

In some implementations, the event data 506 may be used to acquire sensor data, such as image data 118, associated with the inventory location 712. For example, after receipt of event data 506, an image sensor 112(3) such as a camera may be determined that is associated with the inventory location 712 as designated by the event data 506. Image data 118 associated with the inventory location 712 may then be obtained. In some implementations, the image data 118 may be obtained by retrieving previously stored image data 118 obtained by the image sensor 112(3).

In some implementations, at 1808, generation of the interaction data 128 may be responsive to the event data 506. For example, the event data 506 may trigger analysis of the processed sensor data by the interaction data module 616 to generate the interaction data 128.

The system may determine the interaction data 128 based at least in part on the event data 506. For example, the event data 506 may be used to trigger the determination of the interaction data 128, select a particular portion of sensor data for processing and analysis, and so forth. First item data 126(1) associated with a first type of item 106 is determined. Second item data 126(2) associated with a second type of item 106 is determined. Interaction data 128 indicative of an interaction with one or more of the first type of item 106 associated with the inventory location 712 or the second type of item 106 associated with the inventory location 712 is determined based at least in part on the capacitance change value. For example, the type of item 106 that has item data 126 that has been determined to have capacitive characteristics that are closest in value to the capacitance change value may be deemed to be the type of item 106 associated with the interaction.

The interaction data 128 may be based at least in part on the comparison of previously stored weight data with weight change data associated with an inventory location 712 at a particular time. For example, responsive to the event data 506, a change in quantity of the first type of item 106 at the inventory location 712 may be determined by dividing the weight change value by the previously stored weight data of a known quantity of items.

The system may determine an interval of time associated with the event data 506. For example, the interval of time may extend from one second before to one second after the time of the event. A set of weight data 114 obtained by the weight sensor 112(1) during the interval of time may be determined. A weight change value may then be determined using the set of weight data 114.

Embodiments may be provided as a software program or computer program product including a non-transitory computer-readable storage medium having stored thereon instructions (in compressed or uncompressed form) that may be used to program a computer (or other electronic device) to perform processes or methods described herein. The computer-readable storage medium may be one or more of an electronic storage medium, a magnetic storage medium, an optical storage medium, a quantum storage medium, and so forth. For example, the computer-readable storage media may include, but is not limited to, hard drives, floppy diskettes, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions. Further, embodiments may also be provided as a computer program product including a transitory machine-readable signal (in compressed or uncompressed form). Examples of transitory machine-readable signals, whether modulated using a carrier or unmodulated, include, but are not limited to, signals that a computer system or machine hosting or running a computer program can be configured to access, including signals transferred by one or more networks. For example, the transitory machine-readable signal may comprise transmission of software by the Internet.

Separate instances of these programs can be executed on or distributed across any number of separate computer systems. Thus, although certain steps have been described as being performed by certain devices, software programs, processes, or entities, this need not be the case, and a variety of alternative implementations will be understood by those having ordinary skill in the art.

Additionally, those having ordinary skill in the art will readily recognize that the techniques described above can be utilized in a variety of devices, environments, and situations. Although the subject matter has been described in language specific to structural features or methodological acts, it is to be understood that the subject matter defined in the appended claims is not necessarily limited to the specific features or acts described. Rather, the specific features and acts are disclosed as illustrative forms of implementing the claims.

What is claimed is:

1. A method comprising:
   determining a first type of item associated with a shelf that comprises an array of capacitive sensors;
   determining item data associated with the first type of item;
   detecting a user interaction with the first type of item on the shelf;
   determining, at a first time before the user interaction is detected, a first set of capacitance values from the array of capacitive sensors, wherein each capacitance value of the first set indicates a baseline capacitance at a particular capacitive sensor;
   determining, at a second time after the user interaction is detected, a second set of capacitance values from the array of capacitive sensors, wherein each capacitance value of the second set indicates capacitance at the particular capacitive sensor;
   determining change values for each of the particular capacitive sensors from the first time to the second time by subtracting capacitance values in the first set from capacitance values in the second set;
   determining a top k set of the change values as sorted in descending order of greatest magnitude to least magnitude, wherein k is a positive integer;
   determining a set of n change values from the top k set that are greater than a threshold value;
   determining a first estimated location relative to the array of capacitive sensors using the set of n change values and the item data as input to a minimum mean square error estimation function;
   accessing weight data from a plurality of weight sensors associated with the shelf at the first time and the second time;
   determining a second estimated location relative to the plurality of weight sensors based on the weight data;
   determining a third estimated location based on the first estimated location and the second estimated location; and
   generating interaction data indicative of the user interaction.

2. The method of claim 1, wherein:
   each weight sensor is located at a different position on the shelf; and
   the interaction data is indicative of the user interaction at the third estimated location.

3. The method of claim 1, further comprising:
   determining a fourth estimated location based on image data acquired using a camera having a field of view including at least a portion of the shelf;
   generating a fifth estimated location based on the first estimated location and the fourth estimated location; and
   wherein the interaction data is indicative of the user interaction at the fifth estimated location.

4. A method comprising:
   detecting a user interaction with one or more types of items stored at an inventory location;
   determining, at a first time before the user interaction is detected, a first set of capacitance values measured by an array of capacitive sensors proximate to the inventory location that stores the one or more types of items, wherein each capacitance value of the first set indicates a baseline capacitance value as measured by a particular capacitive sensor;
   determining, at a second time after the user interaction is detected, a second set of capacitance values measured by the array of capacitive sensors, wherein each capacitance value of the second set indicates a capacitance value as measured by the particular capacitive sensor;
   determining one or more change values from the first time to the second time based on the capacitance values in the first set and the capacitance values in the second set;
   determining a first estimated location using at least a portion of the one or more change values;
   accessing second sensor data from one or more second sensors associated with the inventory location, wherein the one or more second sensors are of a different type than the capacitive sensors;
determining a second estimated location using the second sensor data;
generating interaction data indicative of the user interaction; and
generating calibration data using the first estimated location and the second estimated location.

5. The method of claim 4, further comprising:
accessing model data comprising one or more models, each model representative of a particular configuration of capacitance change values and a location associated with that particular configuration;
determining a correspondence between the one or more change values and one of the one or more models, wherein the correspondence is within a threshold value; and
wherein the determining the first estimated location uses a location associated with the one of the one or more models.

6. The method of claim 4, wherein:
the inventory location comprises a shelf; and
each capacitive sensor of the array of capacitive sensors comprises an electrically conductive element comprising a coating applied to a portion of the shelf electrically connected to capacitive sensing circuitry.

7. The method of claim 4, wherein the one or more second sensors comprise a plurality of weight sensors, and the method further comprising:
determining, at the first time, a first set of weight values measured by the plurality of weight sensors at the inventory location each located at a different position, wherein each weight value of the first set indicates a weight value as measured by a particular weight sensor;
determining, at the second time, a second set of weight values measured by the plurality of weight sensors, wherein each weight value of the second set indicates a weight value as measured by the particular weight sensor;
generating weight change values based on the first set of weight values and the second set of weight values;
determining the second estimated location by determining a center of weight change location based on the weight change values; and
determining the user interaction occurs at one or more of a plurality of lanes of the inventory location based on the first estimated location and the center of weight change location.

8. The method of claim 4, further comprising:
determining the first estimated location using data indicative of a width and depth of a type of item and a composition of the type of item.

9. The method of claim 4, wherein the one or more second sensors comprise an image sensor, and the method further comprising:
determining the second estimated location based on image data acquired using the image sensor having a field of view that includes at least a portion of the inventory location, wherein the calibration data is indicative of a difference between the first estimated location and the second estimated location; and
determining a third estimated location based on the first estimated location and the calibration data.

10. The method of claim 4, further comprising:
determining the one or more types of items associated with the inventory location;
determining item data associated with the one or more types of items, wherein the item data is indicative of a width and a depth of the one or more types of items;
determining an item area associated with the one or more types of items using the item data;
determining an inventory area associated with the inventory location designated for stowage of the one or more types of items; and
determining the first estimated location for a center of the item area for the one or more types of items is within the inventory area.

11. The method of claim 4, further comprising:
determining the one or more types of items proximate to the inventory location;
determining item data associated with the one or more types of items, wherein the item data is indicative of a width and a depth of the one or more types of items;
determining an item area associated with the one or more types of items using the item data;
determining an inventory area associated with the inventory location designated for stowage of the one or more types of items; and
determining the first estimated location for a center of the item area for the one or more types of items is within the inventory area.

12. The method of claim 4, further comprising:
accessing data indicative of one or more predetermined lanes at the inventory location; and
determining a first lane of the one or more predetermined lanes that is one or more of:
closest to the first estimated location, or
encompasses the first estimated location; and
wherein the interaction data is indicative of the user interaction at the first lane.

13. The method of claim 4, wherein the determining the first estimated location uses the one or more change values as input to a linear quadratic estimate function.

14. The method of claim 4, further comprising:
determining the first estimated location using a minimum mean square error estimation function with the one or more change values as input.

15. A method comprising:
detecting a user interaction with a first type of item at an inventory location;
determining a first set of capacitance values obtained at a first time before the user interaction is detected as measured by a plurality of capacitive sensors proximate to the inventory location;
determining a second set of capacitance values obtained at a second time after the user interaction is detected as measured by the plurality of capacitive sensors;
determining a set of change values from the first time to the second time using the first set of capacitance values and the second set of capacitance values;
determining top k entries in the set of change values as sorted in descending order of greatest magnitude to least magnitude, wherein k is a positive integer;
determining a first estimated location using at least a portion of the set of change values;
accessing second sensor data from one or more second sensors associated with the inventory location, wherein the one or more second sensors are of a different type than the capacitive sensors;
determining a second estimated location using the second sensor data;

determining a third estimated location based on the first estimated location and the second estimated location; and generating interaction data indicative of the user interaction.

16. The method of claim 15, further comprising:
determining a set of n change values from the top k entries that are greater than a threshold value; and
wherein the determining the first estimated location uses the set of n change values as input to a minimum mean square error estimation function.

17. The method of claim 15, wherein the one or more second sensors comprise a plurality of weight sensors, and the method further comprising:
determining weight change data as measured by the plurality of weight sensors; and
determining the third estimated location based on the first estimated location and the weight change data.

18. The method of claim 15, wherein the one or more second sensors comprise an image sensor, and the method further comprising:
determining the second estimated location based on image data acquired using the image sensor having a field of view that includes at least a portion of the inventory location; and
generating the third estimated location based on the first estimated location and the second estimated location.

19. The method of claim 15, further comprising:
determining a difference between the first estimated location and the second estimated location;
generating calibration data using the difference between the first estimated location and the second estimated location;
determining a third set of capacitance values obtained at a third time as measured by the plurality of capacitive sensors proximate to the inventory location;
determining a fourth set of capacitance values obtained at a fourth time as measured by the plurality of capacitive sensors;
determining a second set of change values using the third set of capacitance values and the fourth set of capacitance values; and
determining a fourth estimated location based on the second set of change values and the calibration data.

20. The method of claim 15, further comprising:
accessing calibration data associated with the plurality of capacitive sensors; and
wherein the determining the first estimated location uses the calibration data.

* * * * *